United States Patent
Neilan et al.

(10) Patent No.: US 11,424,109 B2
(45) Date of Patent: Aug. 23, 2022

(54) CARRIER WITH VERTICAL GRID FOR SUPPORTING SUBSTRATES IN COATER

(71) Applicant: View, Inc., Milpitas, CA (US)

(72) Inventors: Bo Neilan, Byhalia, MS (US); Michael Potter, Huntington Beach, CA (US); Dhairya Shrivastava, Los Altos, CA (US)

(73) Assignee: View, Inc., Milpitas, CA (US)

( * ) Notice: Subject to any disclaimer, the term of this patent is extended or adjusted under 35 U.S.C. 154(b) by 0 days.

(21) Appl. No.: 15/733,514

(22) PCT Filed: Mar. 7, 2019

(86) PCT No.: PCT/US2019/021227
§ 371 (c)(1),
(2) Date: Aug. 18, 2020

(87) PCT Pub. No.: WO2019/177871
PCT Pub. Date: Sep. 19, 2019

(65) Prior Publication Data
US 2020/0381223 A1    Dec. 3, 2020

Related U.S. Application Data

(63) Continuation-in-part of application No. 14/893,502, filed as application No. PCT/US2014/041569 on Jun. 9, 2014, now Pat. No. 11,133,158.
(Continued)

(51) Int. Cl.
*H01J 37/32* (2006.01)
*H01L 21/677* (2006.01)
(Continued)

(52) U.S. Cl.
CPC ........ *H01J 37/32715* (2013.01); *C23C 14/34* (2013.01); *C23C 14/50* (2013.01);
(Continued)

(58) Field of Classification Search
CPC ........... H01J 37/32715; H01J 37/32651; H01J 37/32779; H01J 2237/026;
(Continued)

(56) References Cited

U.S. PATENT DOCUMENTS 3,666,254 A    5/1972 Stanke
3,942,967 A    3/1976 Jack et al.
(Continued)

FOREIGN PATENT DOCUMENTS

CN    101834155 A    9/2010
CN    101980935 A    2/2011
(Continued)

OTHER PUBLICATIONS

U.S. Office Action dated Jul. 30, 2018 in U.S. Appl. No. 14/893,502.
(Continued)

*Primary Examiner* — Jennifer Wecker
*Assistant Examiner* — Patrick S Ott
(74) *Attorney, Agent, or Firm* — Weaver Austin Villeneuve & Sampson LLP; Brian D. Griedel

(57) ABSTRACT

Various embodiments herein relate to carriers for supporting one or more substrate as the substrates are passed through a processing apparatus. In many cases, the substrates are oriented in a vertical manner The carrier may include a frame and vertical support bars that secure the glass to the frame. The carrier may lack horizontal support bars. The carrier may allow for thermal expansion and contraction of the substrates, without any need to provide precise gaps between adjacent pairs of substrates. The carriers described herein substantially reduce the risk of breaking the processing apparatus and substrates, thereby achieving a more efficient process. Certain embodiments herein relate to methods of loading substrates onto a carrier.

11 Claims, 17 Drawing Sheets

Related U.S. Application Data

(60) Provisional application No. 62/681,008, filed on Jun. 5, 2018, provisional application No. 62/642,525, filed on Mar. 13, 2018, provisional application No. 61/833,366, filed on Jun. 10, 2013.

(51) Int. Cl.
　　*H01L 21/673*　　(2006.01)
　　*C23C 14/56*　　(2006.01)
　　*C23C 14/50*　　(2006.01)
　　*C23C 14/34*　　(2006.01)

(52) U.S. Cl.
　　CPC .......... *C23C 14/562* (2013.01); *C23C 14/568* (2013.01); *H01J 37/32651* (2013.01); *H01J 37/32779* (2013.01); *H01L 21/6734* (2013.01); *H01L 21/6776* (2013.01); *H01L 21/67712* (2013.01); *H01J 2237/026* (2013.01); *H01J 2237/2007* (2013.01); *H01J 2237/20221* (2013.01); *H01J 2237/332* (2013.01)

(58) Field of Classification Search
　　CPC ..... H01J 2237/2007; H01J 2237/20221; H01J 2237/332; C23C 14/34; C23C 14/50; C23C 14/562; C23C 14/568; H01L 21/6734; H01L 21/67712; H01L 21/6776; B65G 13/02; C03B 25/12
　　USPC .................... 118/500, 728, 729; 204/298.15; 156/345.51
　　See application file for complete search history.

(56) References Cited

U.S. PATENT DOCUMENTS

| | | | |
|---|---|---|---|
| 4,626,207 | A | 12/1986 | Aubry et al. |
| 4,770,121 | A | 9/1988 | Ebata et al. |
| 5,244,559 | A | 9/1993 | Latz |
| 5,263,571 | A | 11/1993 | Crandall et al. |
| 5,683,561 | A | 11/1997 | Hollars et al. |
| 6,047,813 | A | 4/2000 | Herzog et al. |
| 7,070,660 | B2 | 7/2006 | Keeton et al. |
| 7,407,358 | B2 | 8/2008 | Takahashi |
| 8,092,607 | B2 | 1/2012 | Pollack et al. |
| 8,177,207 | B2* | 5/2012 | Waters ................ B05B 13/0285 269/55 |
| 11,133,158 | B2 | 9/2021 | Frank et al. |
| 2002/0033133 | A1 | 3/2002 | Klein et al. |
| 2005/0019678 | A1 | 1/2005 | Nakatsu et al. |
| 2006/0219547 | A1 | 10/2006 | Tuttle |
| 2007/0068802 | A1* | 3/2007 | Gebele .................... C23C 14/50 204/298.02 |
| 2009/0139864 | A1 | 6/2009 | Nakamura et al. |
| 2010/0044213 | A1 | 2/2010 | Wolf et al. |
| 2010/0194505 | A1* | 8/2010 | Brass ................ H01L 21/68728 335/285 |
| 2012/0048186 | A1* | 3/2012 | Bruning .................. C23C 14/50 118/500 |
| 2013/0222878 | A1 | 8/2013 | Greer et al. |
| 2013/0263784 | A1 | 10/2013 | Lee et al. |
| 2015/0348823 | A1* | 12/2015 | Chia ................ H01L 21/68742 269/296 |
| 2016/0002780 | A1* | 1/2016 | Heimel ................... C23C 14/50 118/729 |
| 2016/0111260 | A1* | 4/2016 | Frank .................... C23C 14/568 204/298.11 |
| 2022/0037130 | A1 | 2/2022 | Frank et al. |

FOREIGN PATENT DOCUMENTS

| | | |
|---|---|---|
| CN | 103814154 A | 5/2014 |
| DE | 9301727 U1 | 3/1993 |
| DE | 4139549 A1 | 6/1993 |
| EP | 2971224 A1 | 1/2016 |
| JP | 11-036074 A | 2/1999 |
| JP | 2006-225748 A | 8/2006 |
| RU | 2297988 C1 | 4/2017 |
| SU | 1491821 A1 | 7/1989 |
| SU | 1616861 A2 | 12/1990 |
| SU | 1719327 A1 | 3/1992 |
| WO | WO2013/044941 A1 | 4/2013 |
| WO | WO2013/082279 A1 | 6/2013 |
| WO | WO2014/200927 A1 | 12/2014 |
| WO | WO-2019177871 A1 | 9/2019 |

OTHER PUBLICATIONS

U.S. Final Office Action dated Mar. 15, 2019 in U.S. Appl. No. 14/893,502.
U.S. Office Action dated Nov. 12, 2019 in U.S. Appl. No. 14/893,502.
U.S. Final Office Action dated Jul. 24, 2020 in U.S. Appl. No. 14/893,502.
Chinese Office Action dated Jun. 5, 2017 in CN Application No. 201480039995.0.
Chinese Office Action dated Jun. 5, 2018 in CN Application No. 201480039995.0.
European Extended Search Report dated Jan. 31, 2017 in EP Application No. 14811203.0.
European Office Action dated Apr. 17, 2019 in EP Application No. 14811203.0.
Indian Office Action date Nov. 14, 2019 in Indian Application No. 4155/KOLNP/2015.
Russian Office Action dated May 21, 2018 in RU Application No. 2015154983.
Russian Office Action dated Feb. 21, 2019 in RU Application No. 2015154983.
International Search Report and Written Opinion dated Oct. 27, 2014 in PCT/US2014/041569.
International Preliminary Report on Patentability dated Dec. 23, 2015 in PCT/US2014/041569.
International Search Report and Written Opinion dated May 29, 2019 PCT/US2019/021227.
Canadian Office Action dated Jul. 30, 2021 in Canadian Application No. 2,914,658.
Canadian Office Action dated Oct. 13, 2020 in Canadian Application No. 2,914,658.
International Preliminary Report on Patentability dated dated Sep. 24, 2020 PCT/US2019/021227.
Office Action dated Jun. 7, 2021 in EP Application No. 14811203.0.
U.S. Notice of Allowance dated May 10, 2021 for U.S. Appl. No. 14/893,502.
U.S. Office Action dated Mar. 8, 2021 in U.S. Appl. No. 14/893,502.
CA Office Action dated Jan. 10, 2022, in Application No. 2,914,658.

\* cited by examiner

CARRIER WITH VERTICAL GRID FOR SUPPORTING SUBSTRATES IN COATER

CROSS-REFERENCE TO RELATED APPLICATIONS

This application is a National Phase Application of PCT Application No. PCT/US2019/021227, filed Mar. 7, 2019, and titled "CARRIER WITH VERTICAL GRID FOR SUPPORTING SUBSTRATES IN COATER," which claims benefit of priority to U.S. Provisional Application No. 62/642,525, filed Mar. 13, 2018, and titled "CARRIER WITH VERTICAL GRID FOR SUPPORTING SUBSTRATES IN COATER," and to U.S. Provisional Application No. 62/681,008, filed Jun. 5, 2018, and titled "CARRIER WITH VERTICAL GRID FOR SUPPORTING SUBSTRATES IN COATER" This application is also a continuation-in-part of U.S. application Ser. No. 14/893,502 filed Nov. 23, 2015, and titled "GLASS PALLET FOR SPUTTERING SYSTEMS," which is a National Phase Application of PCT Application No. PCT/US2014/041569 filed Jun. 9, 2014, and titled "GLASS PALLET FOR SPUTTERING SYSTEMS," which claims the benefit of Provisional Application No. 61/833,366, filed Jun. 10, 2013, and titled "GLASS PALLET FOR SPUTTERING SYSTEMS."

BACKGROUND

Electrochromic devices can be formed on substrates in a variety of manners. Typically, the substrate is substantially transparent and planar, and may be made of glass, plastic, or a similar material. To form the electrochromic device, the substrate is coated with various layers of material such as transparent conductive layers, a cathodically coloring electrochromic layer, and an anodically coloring counter electrode layer. Additional layers may be provided as desired, and may include, but are not limited to, an ion conductor layer, a defect-mitigating insulating layer, an anti-reflective layer, a protective oxide or nitride layer, etc. One or more of these layers may be formed in a coater such as a sputter coater. In some cases, all of these layers may be formed in the coater. A carrier is used to support the substrates as they are processed in the coater. The carrier may support a single substrate or multiple substrates.

SUMMARY

Various embodiments herein relate to carriers for holding substrates in a substantially vertical orientation while the substrates are passed through a coater. The coater provides a coating on at least a front surface of the substrates. In many cases, the coating is an electrochromic device.

In one aspect of the embodiments herein, a carrier for holding at least one substrate in a substantially vertical orientation while passing through a coater that provides a coating on at least a front surface of the at least one substrate is provided, the carrier including: a bottom tap bar; a top tap bar; a plurality of vertical support bars, each vertical support bar having a length permitting engagement with both the top tap bar and the bottom tap bar, where the plurality of vertical support bars include at least a leftmost and a rightmost vertical support bar, and where the plurality of vertical support bars in combination with the bottom and top tap bars define one or more aperture; and a plurality of attachments for engaging with the bottom tap bar and the top tap bar to permit horizontal movement of at least one of the plurality of vertical support bars along the bottom and top tap bars.

In certain embodiments, the carrier may further include a plurality of fasteners for fastening ends of the substrate to the vertical support bars, where each vertical support bar has a plurality of fastener attachment positions for attaching to the plurality of fasteners at a plurality of vertical positions. In these or other embodiments, each vertical support bar may engage with the substrate along a flat surface of the vertical support bar. In some implementations, each fastener may include at least one pin or peg. In some such cases, each fastener may include at least two pins or pegs. In these or other embodiments, the plurality of fastener attachment positions may include a plurality of slots, holes, grooves, or other openings in the vertical support bars.

In some implementations, a horizontal dimension of the at least one aperture may be between about 50 inches and 200 inches. In these or other embodiments, a vertical dimension of the aperture may be between about 50 inches and 150 inches.

Various materials may be used. In some cases, the substrate may include glass or plastic. In these or other embodiments, the substrate may be a window that is to be coated with an electrochromic device. In these or other embodiments, the plurality of attachments may be configured to move to accommodate thermal expansion of the substrate. In these or other embodiments, at least one of the plurality of attachments may include a spring that accommodates the thermal expansion of the substrate. In various implementations, the bottom tap bar and/or top tap bar may include metal. In these or other embodiments, the plurality of vertical support bars may include metal.

A number of additional features may be provided in some cases. For example, the carrier may further include a transport mechanism for moving the carrier through the coater. In these or other embodiments, the carrier may include a shield configured to protect at least a portion of the carrier during coating. In these or other embodiments, the carrier may be configured to allow the substrates to be stacked in the carrier in a way that permits substrates of different widths to be vertically stacked on top of one another. In these or other embodiments, the plurality of attachments may be configured to limit movement of the plurality of vertical support bars in a direction that is orthogonal to a plane defined by a vertical and a horizontal direction of the carrier.

In another aspect of the embodiments herein, a carrier for holding multiple substrates in a substantially vertical orientation while passing through a coater that provides a coating on at least a front surface of the multiple substrates is provided, the carrier including: a frame with an aperture having a horizontal dimension and a vertical dimension; a bottom tap bar affixed to the frame and extending horizontally along a bottom portion of the aperture; a top tap bar affixed to the frame and extending horizontally along a top portion of the aperture; a plurality of vertical support bars, each having (i) a length permitting engagement with both the top tap bar and the bottom tap bar while extending vertically across the aperture, and (ii) a moveable attachment for moveably engaging with at least one of the bottom tap bar and the top tap bar to permit horizontal movement of the vertical support bar within the aperture; and a plurality of fasteners for fastening edges of the substrates to the vertical support bars, where each vertical support bar has a plurality of fastener attachment positions for attaching to the fasteners at a plurality of vertical positions.

In certain implementations, the fasteners may be pins or pegs. In these or other embodiments, the plurality of fastener attachment positions may include a plurality of slots, holes, grooves, or other openings in the vertical support bars. In these or other embodiments, the horizontal dimension of the aperture may be between about 50 inches and 200 inches. In these or other embodiments, the vertical dimension of the aperture may be between about 50 inches and 150 inches. In some cases, the moveable attachment may include a rail, channel, or groove.

Various different materials may be used. In some embodiments, the substrates may be glass or plastic. In these or other embodiments, the substrates may be windows for coating with an electrochromic device. In these or other embodiments, the frame may include metal. In these or other embodiments, the bottom tap bar and/or top tap bar may include a material that accommodates a thermal expansion property of the substrates. In these or other embodiments, the bottom tap bar and/or top tap bar may include metal. In these or other embodiments, the vertical support bars may include metal.

A number of additional features may be provided in various implementations. For example, the carrier may further include a pivot peg attached to the top tap bar. In these or other embodiments, the carrier may further include a transport mechanism for moving the carrier through the coater. In these or other embodiments, the carrier may further include a shield configured to protect at least a portion of the frame during coating.

In another aspect of the embodiments herein, a carrier for holding multiple substrates in a substantially vertical orientation while passing through a coater that provides a coating on at least a front surface of the multiple substrates is provided, the carrier including: a frame with an aperture having a horizontal dimension and a vertical dimension; a bottom tap bar affixed to the frame and extending horizontally along a bottom portion of the aperture; a top tap bar affixed to the frame and extending horizontally along a top portion of the aperture; a plurality of vertical support bars, each (i) having a length permitting engagement with both the top tap bar and the bottom tap bar while extending vertically across the aperture, and (ii) being positioned behind the substrates during coating such that back surfaces of the substrates are positioned between the front surfaces of the substrates and the vertical support bars; and a plurality of fasteners for fastening edges of the substrates to the vertical support bars, where each vertical support bar has a plurality of fastener attachment positions for attaching to the fasteners at a plurality of vertical positions, and where the substrates can be stacked in the carrier in a way that permits substrates of different widths to be vertically stacked on top of one another in the aperture.

In some such embodiments, the fasteners may be pins or pegs. In these or other embodiments, the plurality of fastener attachment positions may include a plurality of slots, holes, grooves, or other openings in the vertical support bars. In these or other embodiments, the horizontal dimension of the aperture may be between about 50 inches and 200 inches. In these or other embodiments, the vertical dimension of the aperture may be between about 50 inches and 150 inches. In some cases, the moveable attachment may include a rail, channel, or groove.

In some cases, the substrates may be glass or plastic. In these or other embodiments, the substrates may be windows for coating with an electrochromic device. In these or other embodiments, the frame may include metal. In these or other embodiments, the bottom tap bar and/or top tap bar may include a material that accommodates a thermal expansion property of the substrates. In these or other cases, the bottom tap bar and/or top tap bar may include metal. In these or other cases, the vertical support bars may include metal.

In certain implementations, the carrier may further include a pivot peg attached to the top tap bar. In these or other embodiments, the carrier may further include a transport mechanism for moving the carrier through the coater. In these or other embodiments, the carrier may further include a shield configured to protect at least a portion of the frame during coating.

DETAILED DESCRIPTION

Figure 1A:
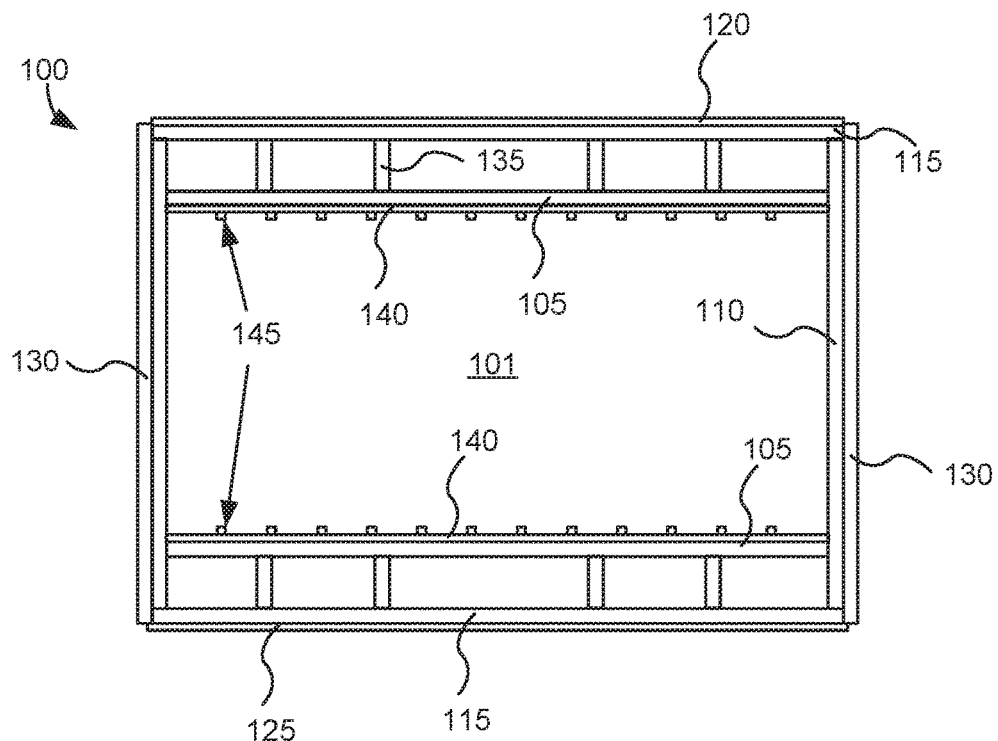
FIGS. 1A and 1B illustrate a carrier for supporting substrates as they move through a processing apparatus.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

One technique to form an electrochromic device on a substrate involves coating the substrate with various layers of material. In many cases, the coating is formed in a coater using sputtering, physical vapor deposition (PVD), or other methods. The coater may include a number of different stations, each configured to deposit one or more of the layers. A carrier may be used to support one or more substrates as the substrates are translated through the coater. While certain embodiments herein are directed to carriers configured to hold one or more substrates as they translate through a sputtering apparatus, for example a sputtering apparatus used to sputter deposit one or more coatings on the substrates, the embodiments are not so limited. Generally, the embodiments described herein may be used to secure any substantially planar substrate as the substrate is passed through a processing apparatus. The processing apparatus is often used to deposit one or more films (in some cases the films forming an electrochromic device), but in some cases the processing apparatus may be used for etching, cleaning, particle removal, polishing, photolithography, etc. Such implementations are within the scope of the disclosed embodiments. In some cases, the processing apparatus forms an electrochromic device that is all solid state and inorganic. Some examples of electrochromic devices can be found in U.S. Pat. No. 8,300,298, which is hereby incorporated by reference in its entirety.

The following terms are defined for the sake of clarity. As used herein, the term "substrate" refers to a planar or substantially planar object that is loaded onto a carrier and processed in a processing apparatus. In many cases the substrate is glass, though plastic and other materials may be used in some cases. Typically, the substrate has dimensions that fall between about 12 inches and 120 inches on each side (e.g., width and height), though this is not intended to be limiting. The substrate may eventually form an electrochromic window or other product with an electrochromic device thereon, or it may be a filler substrate that is not fabricated into an end product. As used herein, the term "carrier" means a structure configured to support one or more substrates as the substrates are passed through a processing apparatus. The carrier may be comprised of various pieces that may permanently or releasably attach to one another. In many cases, the carrier includes a frame and an aperture within the frame. As used herein, the term "aperture" refers to the area in a carrier where the substrate(s) are loaded for processing. In many cases, the aperture is substantially open (e.g., it does not include a solid backing). As used herein, the terms "vertical grid mount" and "tap bar" are used interchangeably to refer to horizontally oriented structures connected to horizontal portions of the frame, which are used to mount the vertical support bars within the aperture. As used herein, the term "vertical support bar" refers to a vertical bar that stretches between the bottom and top of the aperture to support the substrate(s) in the aperture. Often, the vertical support bars mount onto the tap bars.

When used in reference to a tap bar, the term "slot" refers to an opening, hole, or depression in the tap bar, into which a portion of the vertical support bars are mounted, or into which another piece of hardware can mount in order to secure the vertical support bars to the tap bar. When used in reference to a vertical support bar, the term "slot" refers to an opening, hole, or depression in the vertical support bar, into which a pin can fit to secure the substrate(s) against the vertical support bar. When used in reference to a vertical support bar or slot, the term "pin" refers to a piece of hardware that fits within a slot to secure the substrate(s) against the vertical support bar. When used in reference to a vertical support bar or adjacent substrates, the term "clip" refers to a piece of hardware that is positioned between two adjacent substrates to maintain separation and co-planarity between the adjacent substrates.

As used herein, the term "pivot peg" refers to a pivot structure that fixedly or releasably attaches to a portion of the carrier (e.g., often the top tap bar or frame) and engages with a top edge of a substrate when the substrate is loaded in the carrier. In many cases, a pivot peg includes a first end that attaches to the top tap bar or frame, and a second end that engages with the top edge of a substrate. The pivot peg secures the edge of the substrate while allowing some movement of the substrate due to thermal expansion.

In many cases herein, substrates are oriented vertically as they are loaded onto the carrier and passed through the processing apparatus. When used herein with respect to the dimensions of a substrate, the "width" of the substrate refers to the horizontal dimension of the substrate. When used herein with respect to the dimensions of the substrate, the "height" of the substrate refers to the vertical dimension of the substrate. When used herein with respect to the dimensions of a substrate, the "thickness" of the substrate refers to the distance between the two co-planar faces of the substrate. Often, the substrates are on the order of few millimeters thick. Similarly, the "width" of the aperture, frame, etc. refers to the dimension of the relevant element in the horizontal direction, while the "height" of the aperture, frame, etc. refers to the dimension of the relevant element in the vertical direction.

As used herein, the "front" side of the substrate refers to the processing face of the substrate. This is the side of the substrate which is acted upon in the processing apparatus. In cases where the processing apparatus is a coater, the front side of the substrate is the side on which film is deposited. The "back" side of the substrate is the face of the substrate opposite the front side.

When fabricating an electrochromic device, a carrier is frequently used to secure one or more substrates as they pass through the coater. The substrates are secured to the carrier in a manner that leaves a processing surface of each substrate substantially exposed for coating. Often, the substrates are passed through the coater in a vertical orientation. However, horizontal processing may also be used.

In various cases, the substrates may be glass, plastic, etc. The substrates may have one or more films already formed thereon. The substrates are typically planar, and they come in a variety of sizes and shapes. Most commonly, the substrates are rectangular or square, but other shapes such as triangles, trapezoids, other polygons, circles, semi-circles, ovals, etc. may also be used. Smaller substrate sizes may be about 14 inches by 14 inches, while larger substrate sizes may be about 72 inches by 120 inches. Any substrate sizes between these examples are also possible. The recited substrate sizes are appropriate for many applications and coaters, though smaller and/or larger substrates may be used in some cases. Often, the substrates have dimensions that are precise to within about ⅛ inch (e.g., within about 3 mm, or 2 mm, or 1 mm).

Prior to passing the substrates through the coater, they are typically loaded onto the carrier. In many cases, multiple substrates of complementary shapes and sizes are loaded onto a single carrier. In certain cases, the carrier includes a full or partial frame and an aperture that is defined, at least partially, by the frame. The aperture is the area of the carrier where the substrate resides while the substrate is supported in the carrier. The aperture may be substantially open in many cases (e.g., the carrier may lack a full/solid backing in the aperture region). Various horizontal and/or vertical support bars may be provided within the frame, wholly or partially crossing the aperture. The substrate may be secured against these horizontal and/or vertical support bars.

Figure 1B:
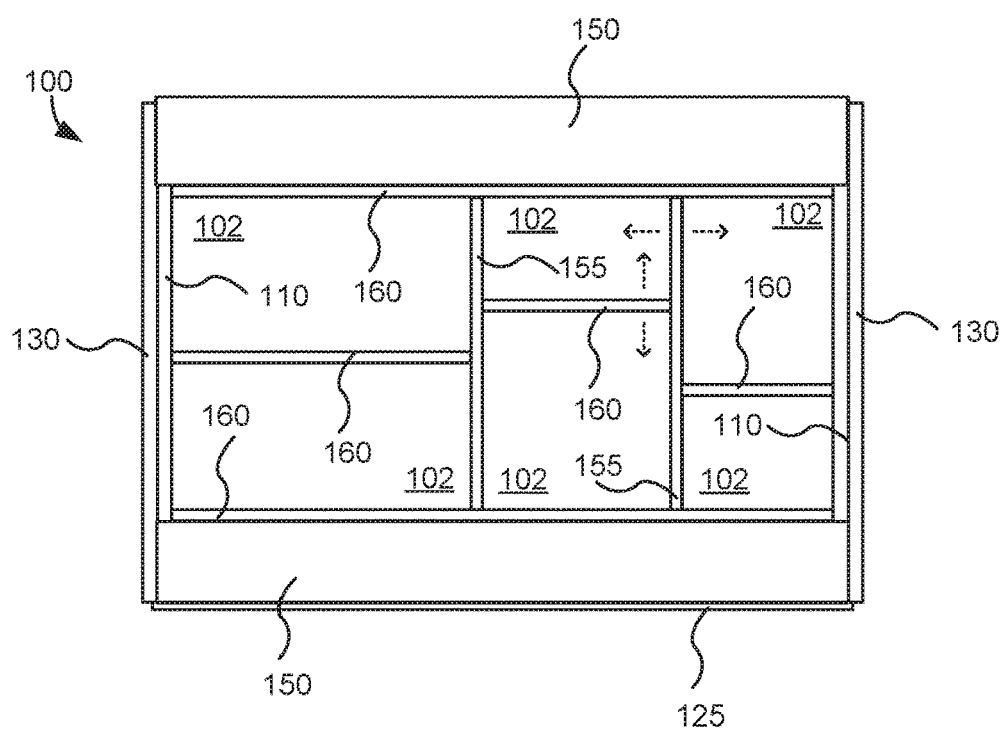

FIGS. 1A and 1B depict a carrier 100 that can be configured to include an adjustable grid array. FIG. 1A illustrates various aspects of the carrier 100 before the substrates are loaded thereon, while FIG. 1B shows the carrier 100 after several substrates 102 have been simultaneously loaded thereon. In this example, the carrier 100 includes vertical frame members 110, as well as horizontal frame members 105 and 115. The horizontal frame members 105 and 115 are welded or otherwise attached together via short struts 135. The vertical frame members 110 mate with (e.g., bolt with) the horizontal frame members 105 and 115 to form the frame of the carrier 100. A guide plate 120, guide rail 125, and overlapping sections 130 are attached (e.g., bolted) to the frame of the carrier 100, as shown in FIG. 1A. An aperture 101 is defined within the frame (e.g., interior of vertical frame members 110 and horizontal frame members 105). Tap bars 140 may be configured along the top and bottom inner edges of the aperture 101. In some cases, the tap bars 140 may be referred to as the top tap bar and bottom tap bar, or as vertical grid mounts. The tap bars 140 shown in FIG. 1A may include a plurality of studs 145 for attaching the vertical support bars 155 shown in FIG. 1B. The studs 145 may slideably engage with the body of the tap bars 140, so that when a vertical support bar 155 is mounted to the stud 145, the assembly can move laterally along the tap bar 140 to accommodate thermal expansion of the substrates. In some cases, clamping blocks may be used in place of the studs 145.

As shown in FIG. 1B, the adjustable grid array includes several horizontal support bars 160, as well as vertical support bars 155. The arrows surrounding certain horizontal support bars 160 and vertical support bars 155 indicate that the support bars have an adjustable position such that various sized substrates can be accommodated within the carrier 100. A shield 150 may cover portions (e.g., front side and/or back side portions) of the carrier 100 during sputtering.

The vertical support bars 155 mount onto the horizontal frame members using tap bars. The tap bars may include an alloy that expands and contracts to approximate the thermal expansion and contraction of the substrates mounted on the carrier during processing. The horizontal support bars 160 may mount onto the vertical support bars 155 through any available mechanism. In some cases the horizontal support bars 160 slideably engage with the vertical support bars 155. The horizontal support bars 160 may be telescopic, such that their length is adjustable. The adjustable length accommodates for thermal expansion, and also allows each horizontal support bar 160 to be used in a variety of fabrication processes involving different specific substrate dimensions. In many cases, the vertical support bars 155 and horizontal support bars 160 are positioned at least partially in front of the substrates (e.g., on the processing face of the substrate). In many cases, this means that at least a portion of the vertical support bars 155 and horizontal support bars 160 are positioned between the substrate and a sputter target used to deposit material on the processing face of the substrate. In the example of FIG. 1B, each substrate 102 is supported at its periphery by a combination of vertical support bars 155 and horizontal support bars 160. The process of loading the substrates 102 onto the carrier 100 is further described below.

Example carriers in line with the carrier 100 described in FIGS. 1A and 1B are further described in U.S. patent application Ser. No. 14/893,502, filed Nov. 23, 2015, and titled "GLASS PALLET FOR SPUTTERING SYSTEMS," which is herein incorporated by reference in its entirety.

Because the substrates come in many sizes and shapes, it is common to load a carrier with substrates of non-uniform size and/or shape, as shown in FIG. 1B. In many cases, the size and shape of the substrates are chosen to fulfill specific customer orders, which request specific dimensions. It can be difficult to fully fill the aperture of the carrier due to the mis-match of sizes and shapes. Filler substrates (e.g., filler glass in many cases) are typically used to fill extra spaces in the aperture that are not occupied by substrates used for production. The filler substrates are sacrificial substrates that will not be further processed or sold (though they may be reused). It is common that only about 60-70% of the aperture area is occupied by substrates that will be fabricated into electrochromic windows, with the remaining area occupied by filler substrates.

While many different techniques can be used to position the substrates and filler substrates within the aperture of the carrier, some techniques introduce certain production line problems. For instance, in one approach in line with the carrier of FIGS. 1A and 1B, the aperture of the carrier is provided with a grid of vertical and horizontal support bars positioned as appropriate to hold the individual substrates in a vertical position for vertical transport through the coater. The top region of the carrier includes a tap bar referred to as the top tap bar, and the lower region of the carrier includes a tap bar referred to as the bottom tap bar. Both the top and bottom tap bars are affixed to the remainder of the carrier structure (e.g., to the frame members). Rigid vertical support bars are attached to the top and bottom tap bars, and telescopic horizontal support bars are attached to the vertical support bars.

When a set of substrates are ready for processing (e.g., coating), installation personnel arrange the vertical support bars within the aperture to accommodate the widths of the different substrates. Substrates of the same width are vertically stacked on top of one another, as shown in FIG. 1B, for instance. The vertical support bars are bolted or otherwise fixedly attached to the top and bottom tap bars. Then, the telescoping horizontal support bars are compressed or extended to appropriate lengths (e.g., to accommodate the widths of the substrates present) and positioned horizontally between the vertical support bars and between adjacent substrates. The vertical and horizontal support bars are positioned on the processing face of the substrate. In other words, the vertical and horizontal support bars are positioned between the substrates and the cathode/sputter target of the coater. As such, the vertical and horizontal support bars mask the peripheral regions of the substrates during coating. In many cases, this masking is undesirable and it would be preferable to deposit the films over the entire processing face of the substrates.

In certain designs, the horizontal support bars are relatively thin and bendable, and can easily be bent out of their desired shape. For instance, thermal expansion (which can result from passing through the coater) can cause the horizontal support bars to bow outward, away from the substrates. This bowing is undesirable because it can cause a horizontal support bar to catch or lodge against the edge of the coater. As a result, the horizontal support bars can become dislodged or break, or they can cause another portion of the apparatus (e.g., a shield) to dislodge or break. These effects can substantially disrupt the production process, and in some cases may cause mechanical disruption, electrical shorting, and unwanted down time. Further, in some cases the deformed horizontal support bars can cause the substrates to break, thus losing valuable production materials.

Another problem introduced by the horizontal support bars, particularly in cases where the horizontal support bars are telescopic, is that such support bars can generate metallic particles that fall onto and contaminate the substrate surface. The metallic particles are generated as the moving/telescoping pieces of the horizontal support bars move over one another. Because the metallic particles are conductive, they can introduce defects to the electrochromic device being formed on the substrate.

A further issue with certain carriers such as the one shown in FIGS. 1A and 1B is that the substrates that are stacked vertically atop one another must have the same width. This is because the vertical support bars separate entire columns of substrates, and the substrates in each column all have the same width. In other words, if the bottom piece in a portion of the carrier has a 20 inch wide substrate loaded thereon, all the substrates loaded above that substrate must also be 20 inches wide. If a substrate has a particular width and there are no other substrates with that same width ready to process, the column in which that substrate is positioned within the aperture of the carrier must be filled with a filler substrate. In practice, this means that a substantial number of filler substrates are used, and a substantial amount of film materials are wasted depositing on the filler substrates. The requirement that all substrates in a vertical column of a carrier have the same width is referred to as "z-stacking."

Another issue with carriers such as the ones shown in FIGS. 1A and 1B is that many different pieces of horizontal support bars need to be maintained. Even though the horizontal support bars may be telescopic to accommodate differing substrate widths, such telescoping can only accommodate a certain degree of width change. Because of the wide range of substrate widths, many different horizontal support bars must be maintained. Substantial storage area and organization is needed to store all of the different horizontal support bars.

Figure 2A:
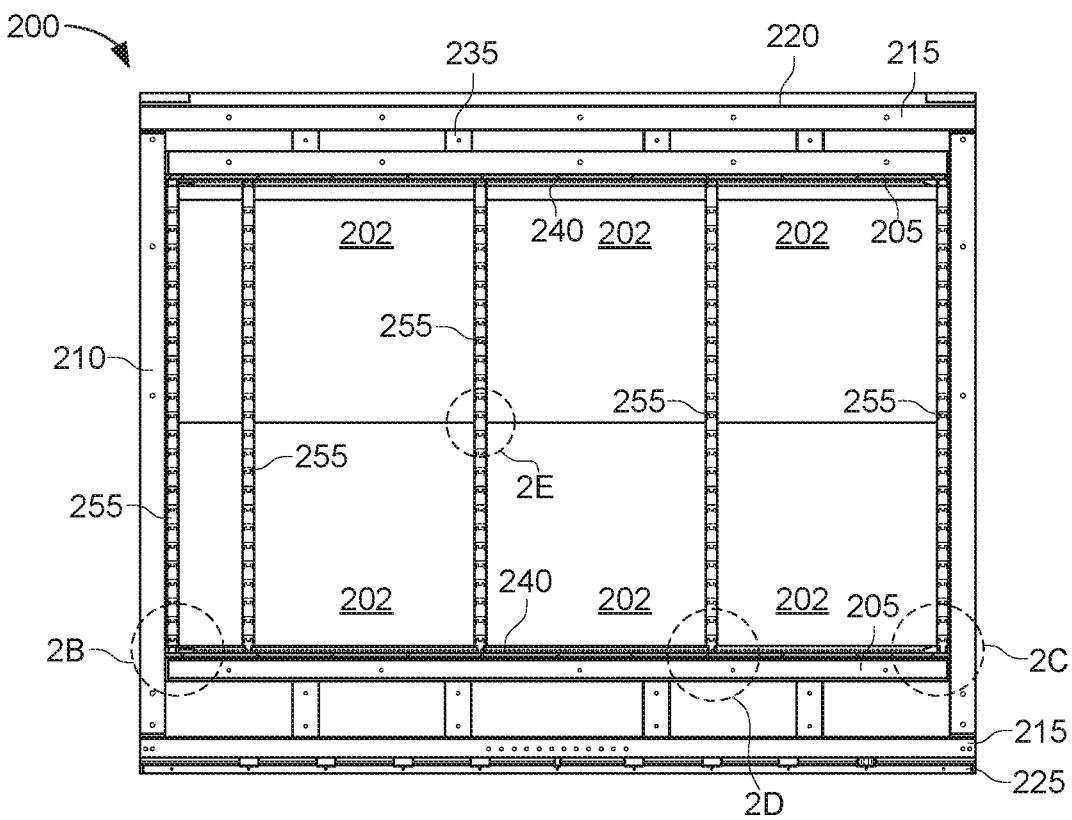
FIG. 2A illustrates a carrier for supporting substrates as they move through a processing apparatus according to one embodiment.
Figure 2B:
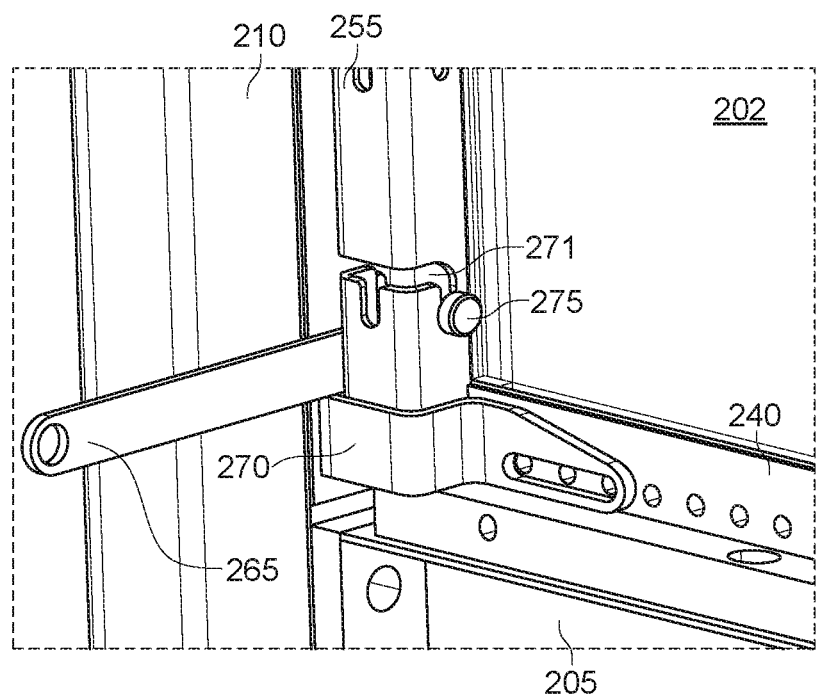
FIGS. 2B-2D illustrate close-up back side views of portions of the embodiment shown in FIG. 2A, showing a vertical support bar installed on a bottom tap bar at different locations along the tap bar.

Various embodiments herein address one or more of the issues described above. FIGS. 2A-2P illustrates different aspects of a carrier 200 according to certain embodiments herein. In this embodiment, no horizontal support bars are used between vertically adjacent substrates 202, and a substantial portion of each vertical support bar is positioned behind the plane of the back face of the substrate 202. Both of these features are contrary to the embodiment of FIGS. 1A and 1B.

As shown in FIG. 2A, the carrier 200 includes many features that are similar to the carrier 100 of FIGS. 1A and 1B. For example, carrier 200 includes horizontal frame members 205 and 215, and vertical frame members 210. The horizontal frame members 205 and 215 are connected together (e.g., welded) through short struts 235. The horizontal frame members 205 and 215 may be connected to the vertical frame members 210 through any available means, and in some cases they are bolted together. A guide plate 220 may be provided atop the upper horizontal frame member 215, and a guide rail 225 may be provided (e.g., bolted, welded, etc.) along the bottom edge of the lower horizontal frame member 215.

Tap bars 240 (sometimes referred to as upper and lower tap bars or vertical grid mounts) are mounted onto the horizontal frame members 205. The tap bars 240 may float or otherwise move to address non-uniform thermal expansion between the tap bars 240 and the remaining portions of the carrier 200 such as the horizontal frame members 205. In some embodiments, the tap bars 240 may be made of a material that has a coefficient of thermal expansion that matches the substrates 200 or a different component of the carrier 200.

In various cases, the tap bars 240 include a guide or rail that protrudes and allows the vertical support bars 255 to slide along the tap bars 240 via a groove. In these or other cases, the tap bars 240 may include a channel in which the vertical support bars 255 sit and can move/slide without coming out of the channel. Notably, the rails, grooves, and/or channels in the tap bar 240 allow the vertical support bars 155 some freedom to move left-and-right to accommodate thermal expansion during processing. In other words, a moveable attachment is provided for moveably engaging the vertical support bar 255 with at least one of the tap bars 240. This eliminates the need to provide precise gaps between horizontally adjacent substrates 202, since the substrates 202 can float and move as they heat and expand. Previously, in cases where the vertical support bars 255 were more fixedly attached to the tap bars 240, it was necessary to provide precise gaps between horizontally adjacent substrates 202 to ensure that adjacent substrates would not exert undue pressure on one another when they heat and expand in their fixed positions. This process was prone to error, and resulted in the loss/breakage of many valuable substrates. The configuration shown in FIGS. 2A-2I is substantially more flexible and less likely to cause breakage of substrates.

Vertical support bars 255 are mounted onto the tap bars 240. A number of substrates 202 are loaded onto the carrier 200 in a vertical orientation. Although not shown in FIG. 2A, a shield (e.g., similar to shield 150 of FIG. 1B) may be provided to cover the top and bottom portions of the carrier 200. FIG. 2A includes several circles labeled 2B, 2C, 2D, and 2E. Each of these circles indicates which portion of the apparatus is being shown in FIGS. 2B, 2C, 2D, and 2E, respectively.

Figure 2C:
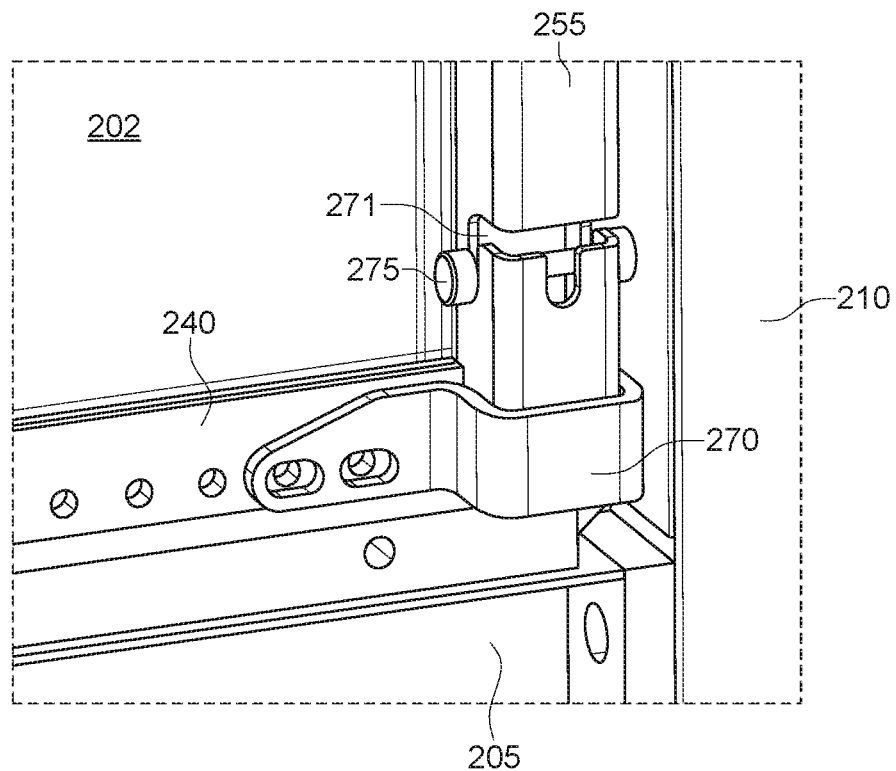
Figure 2D:
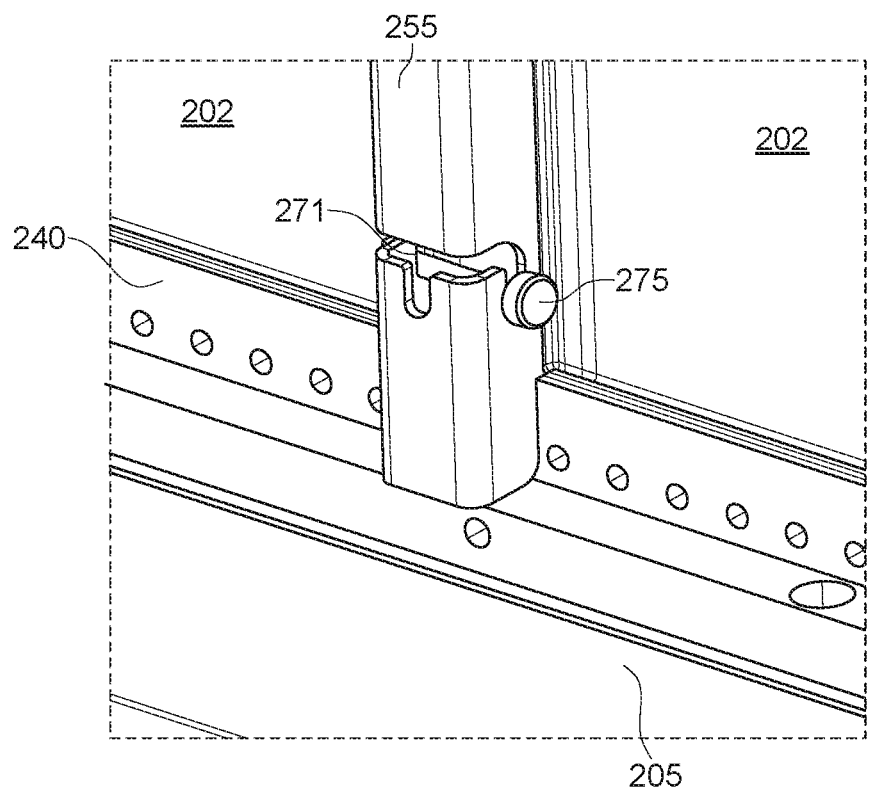
Figure 2E:
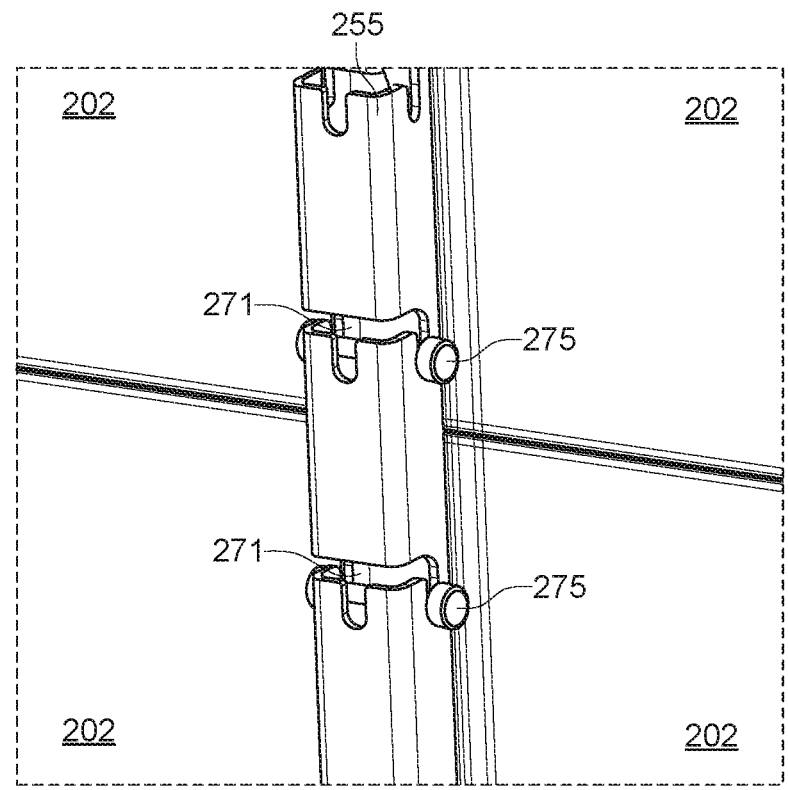
FIG. 2E shows a close-up back side view of a portion of the embodiment shown in FIG. 2A, illustrating a vertical support bar separating two adjacent columns of substrates.
Figure 3:
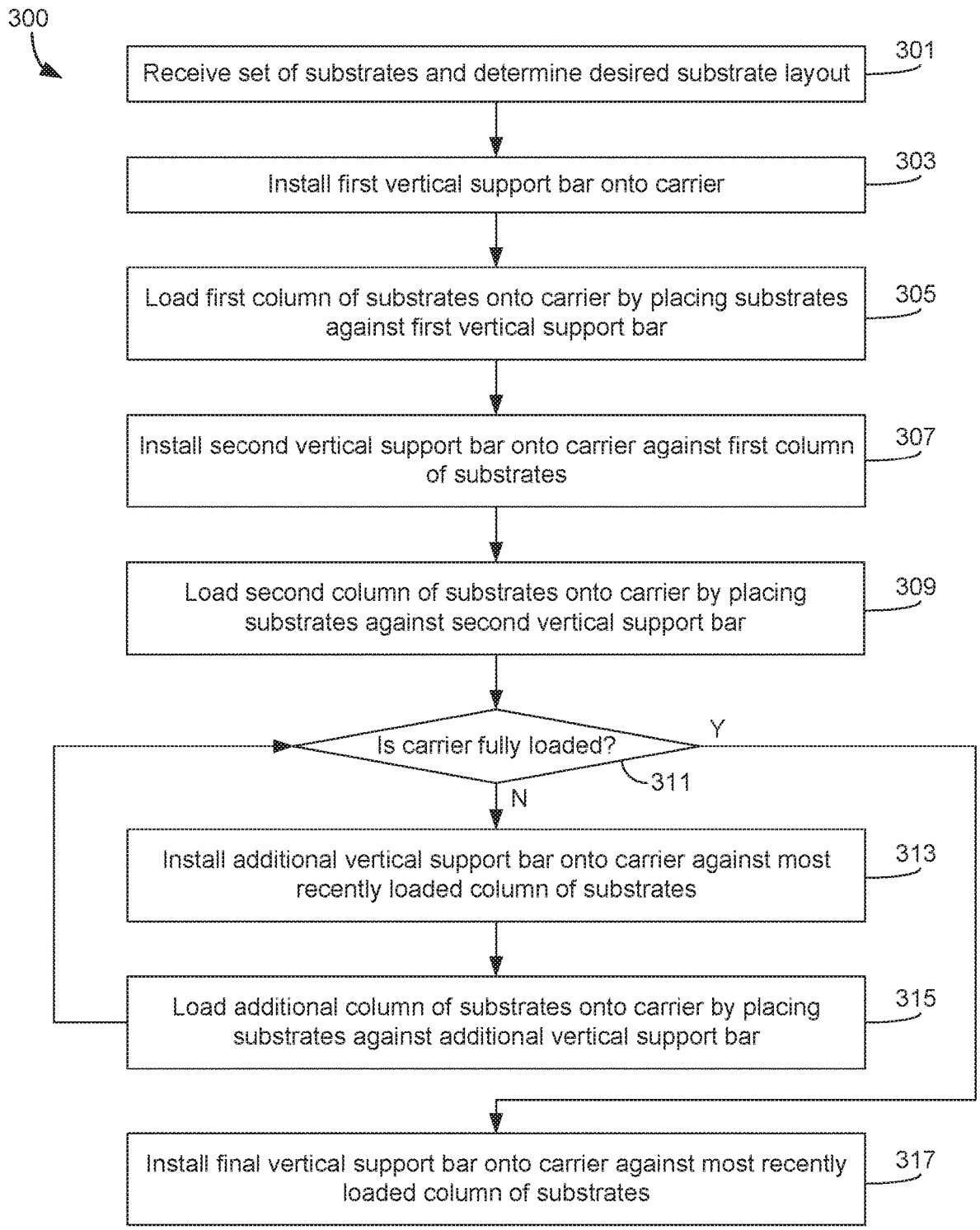
FIG. 3 is a flowchart describing a method of loading substrates onto the carrier described in relation to FIGS. 2A-2P.

The substrates 202 may be loaded onto the carrier 200 using the method 300 shown in FIG. 3, which is described in the context of the structures shown in FIGS. 2A-2E. The method 300 begins with operation 301, where a set of substrates 202 is received for processing. During this operation, the desired substrate layout is determined (e.g., it is determined where each substrate 202 will be positioned on the carrier 200). For example, substrates of matching widths can be grouped together in columns. Next, at operation 303, the first vertical support bar 255 is installed onto the carrier 200. The vertical support bars 255 are designed to hold the substrates in place, and connect the remainder of the carrier 200 to the glass, e.g., through the tap bars 240. In some cases, the first vertical support bar 255 may remain installed on the carrier 200, and this operation may be omitted. Typically, the first vertical support bar 255 is installed between the tap bars 240 that are attached to the horizontal frame members 205. The first vertical support bar 255 (and remaining vertical support bars 255) may slideably mount onto the tap bars 240 in some cases. For instance, the vertical support bars 255 may slide into place horizontally along the tap bars 240 to a position that effectively aligns with the vertical edges of one or more of the substrates 202 in the carrier 200.

FIG. 2C illustrates the first vertical support bar 255 installed against the vertical frame member 210. Notably, FIG. 2C (as well as FIGS. 2B and 2D-2I) illustrates these elements from a "back side" perspective. In other words, the front side/processing side of the substrate faces into the page, while the back side of the substrate faces out of the page. In this example, the first vertical support bar 255 is installed flush against the vertical frame member 210, though in some cases a spacer (not shown) may be provided between the first vertical support bar 255 and the vertical frame member 210. A bracket 270 or other connecting structure may be provided to secure the first vertical support bar 255 onto the tap bars 240, as shown in FIG. 2C. The bracket may wrap around a portion of the first vertical support bar 255, and may include one or more openings that allow the bracket to be connected to the tap bar 240. Brackets 270 provide one example of securing first vertical support bars 255 to tap bars 240. However, securement of first vertical support 255 bars does not necessarily need to be provided by a fixed in place bracket 270.

Figure 2F:
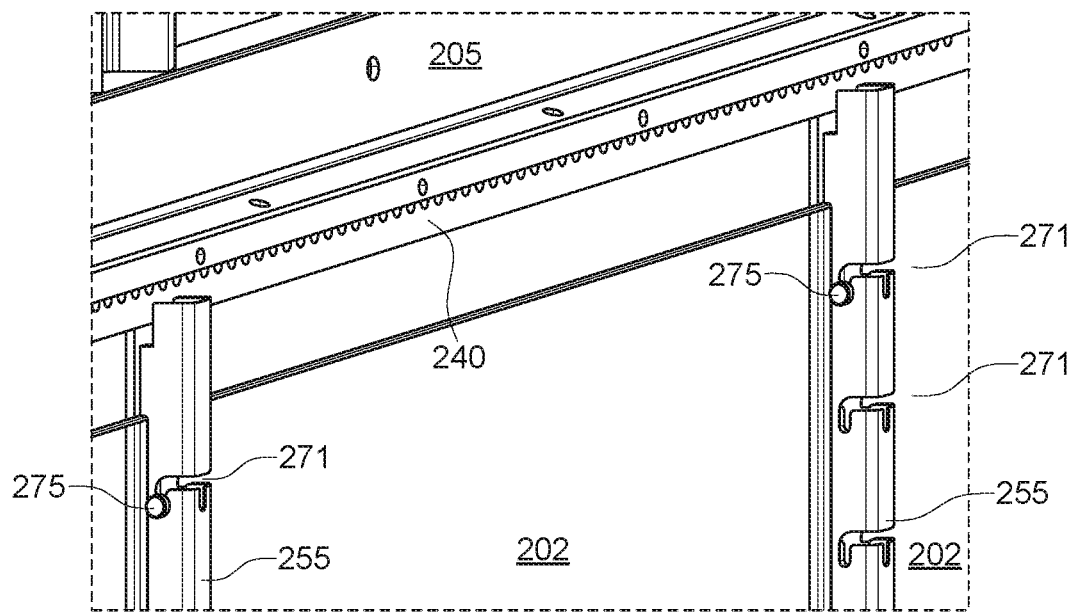
FIG. 2F depicts a close-up back side view of a portion of the embodiment shown in FIG. 2A, showing the top tap bar.
Figure 2G:
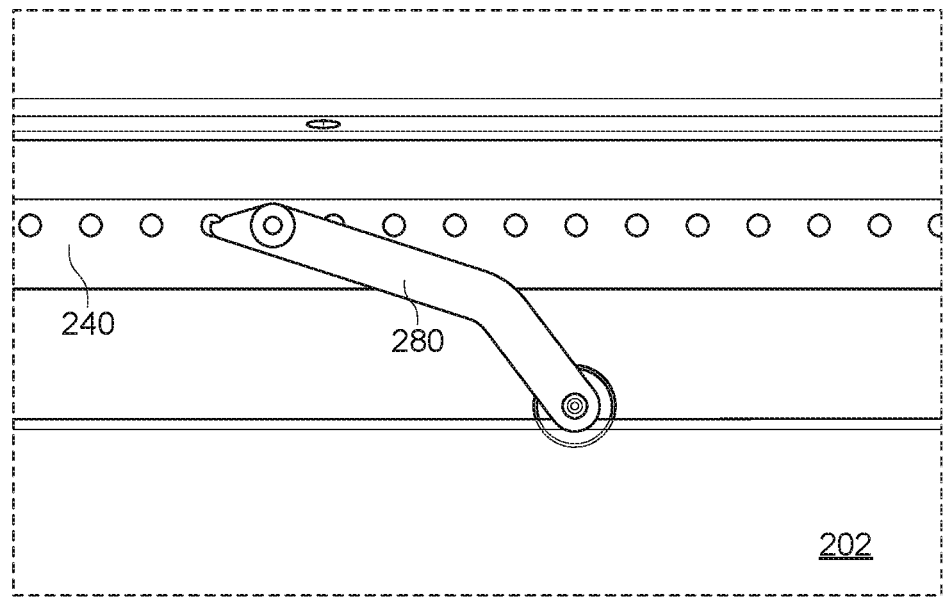
FIGS. 2G-2I each illustrates a pivot peg installed along a top tap bar and engaging the top edge of a substrate.
Figure 2H:
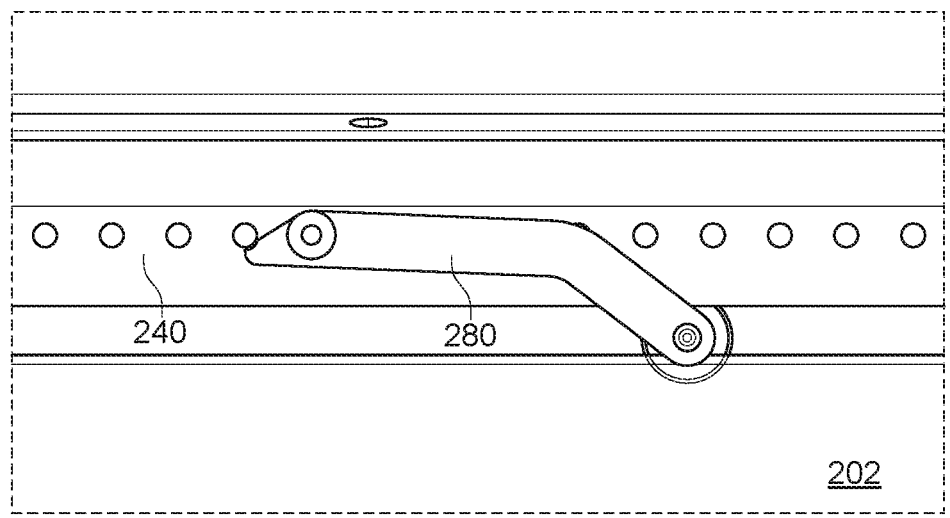
Figure 2I:
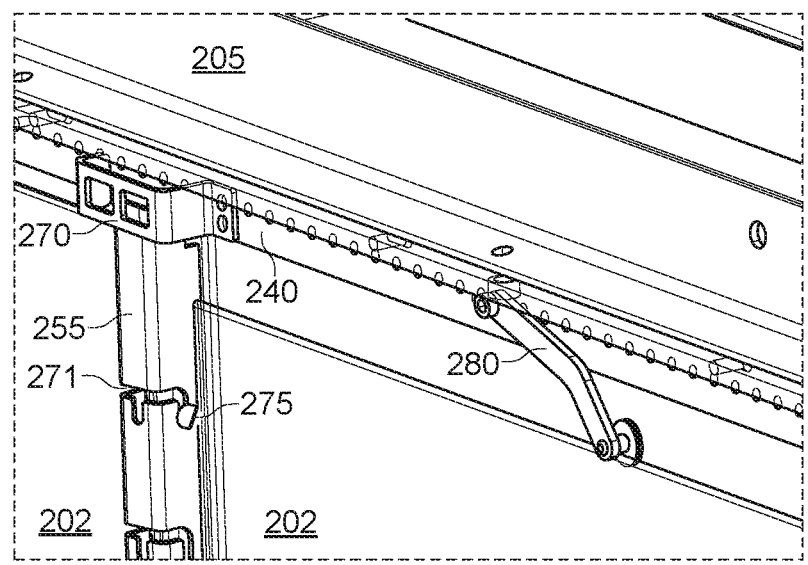
Figure 2J:
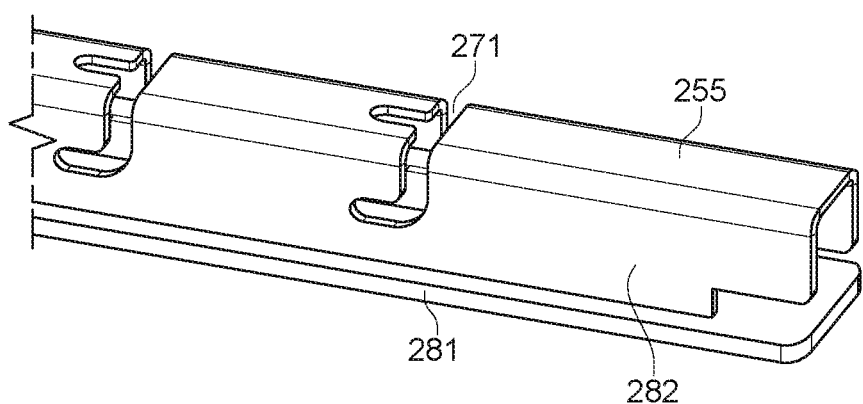
FIGS. 2J-2O show different views of vertical support bars according to several embodiments.
Figure 2K:
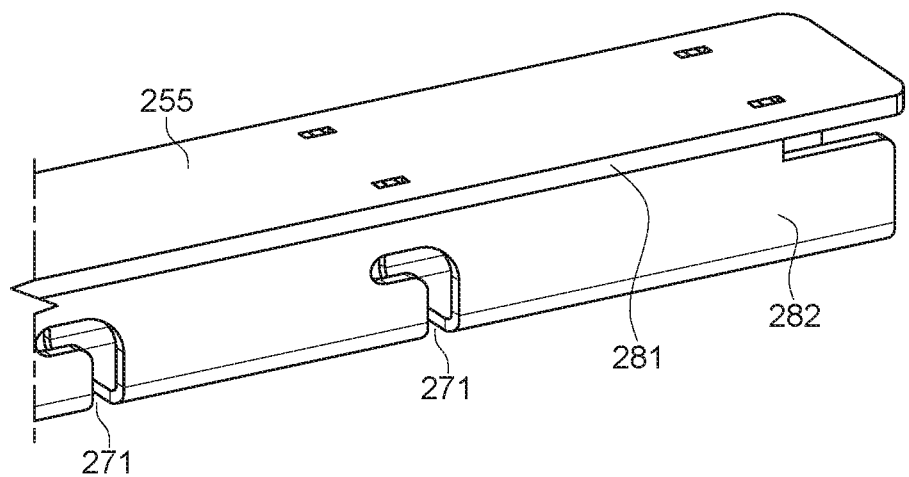
Figure 2L:
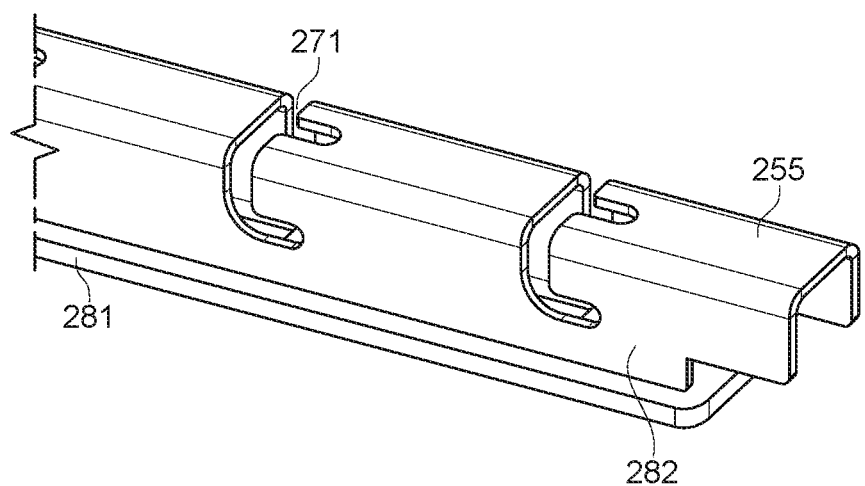
Figure 2M:
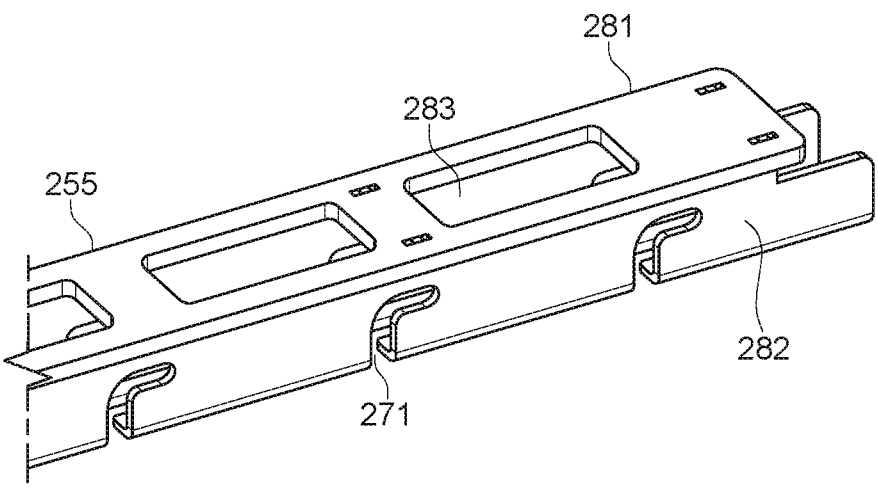
Figure 2N:
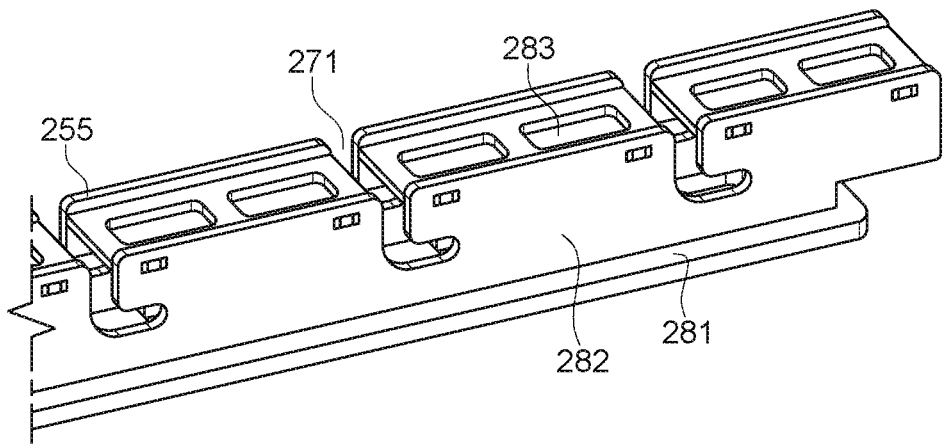
Figure 2O:
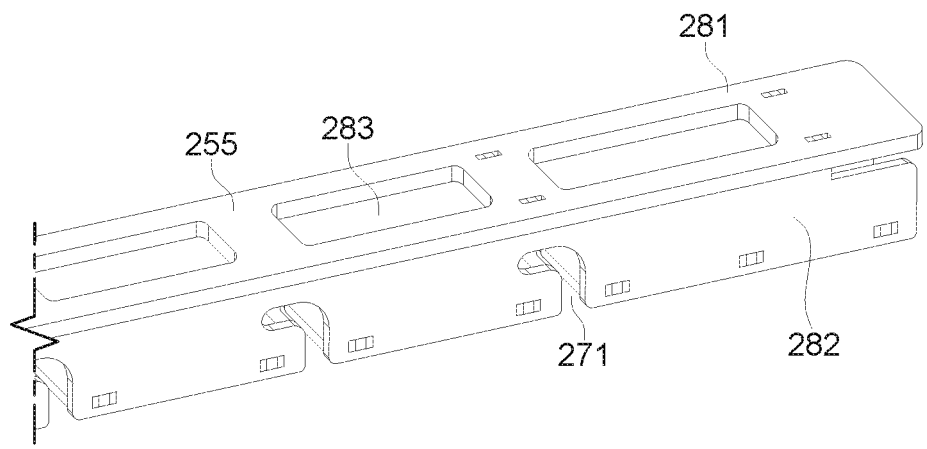
Figure 2P:
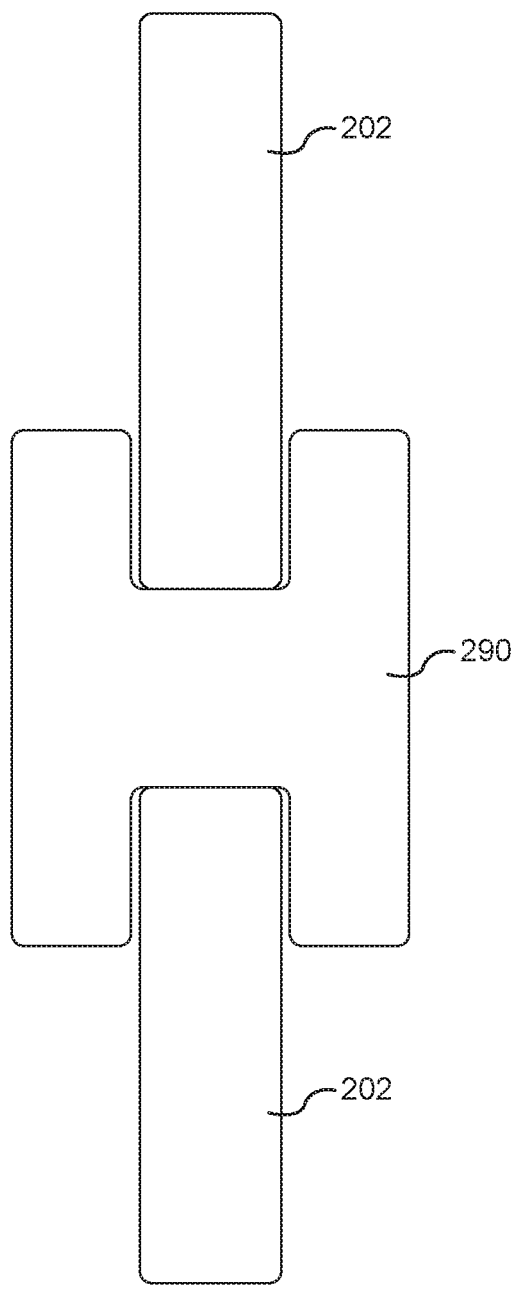
FIG. 2P illustrates a cross-sectional view of a clip that may be used to separate vertically adjacent substrates according to certain embodiments.
Figure 2Q:
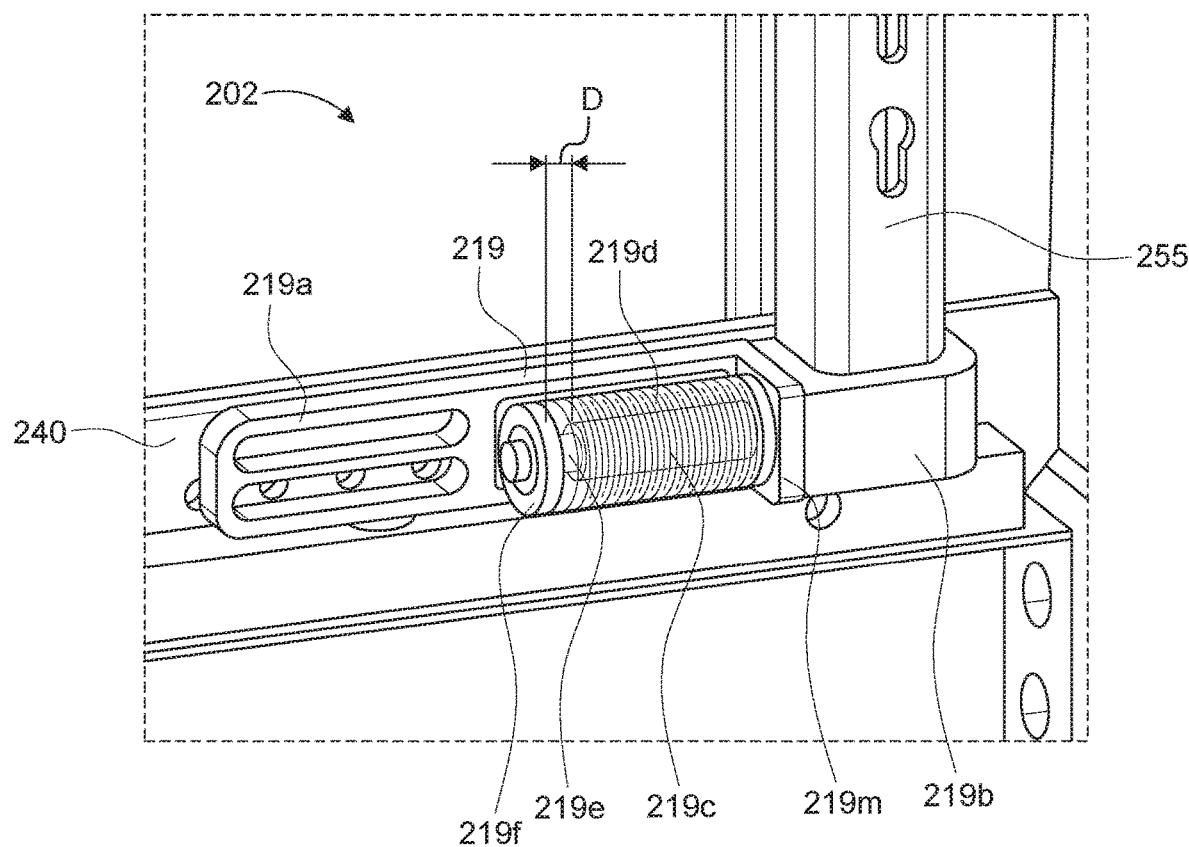
FIGS. 2Q and 2R illustrate a first vertical support bar that is secured to a tap bar by a spring clamp.
Figure 2R:
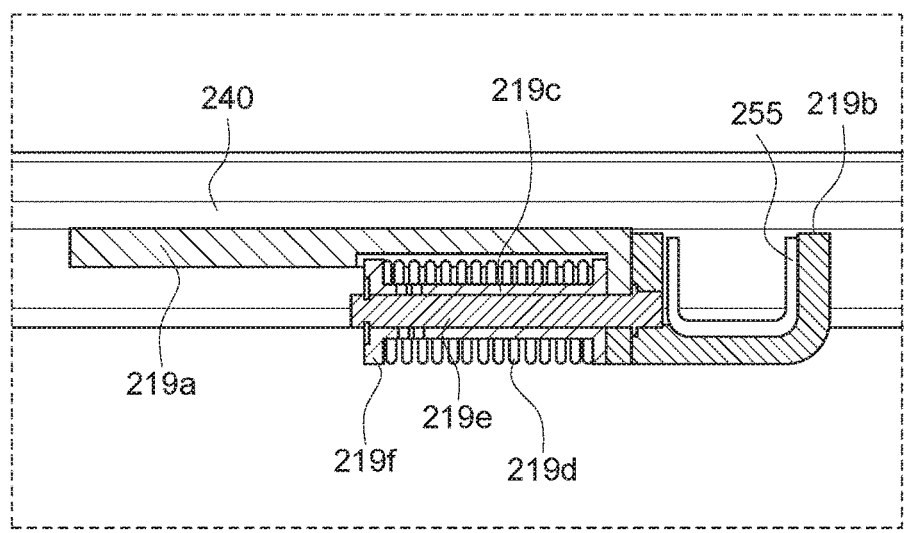

As represented in front perspective view in FIG. 2Q and top cross-sectional view in FIG. 2R, in another embodiment, a first vertical support bar 255 is secured to tap bar 240 by a spring clamp 219. The spring clamp 219 may be particularly useful for ensuring that the edges of the substrates remain in contact with and supported by the vertical support bars during the course of processing. Each spring clamp 219 comprises an attachment portion 219a configured at a first end to be coupled to tap bar 240 by one or more fasteners (not shown) positioned within an aperture of spring clamp 219. Each spring clamp 219 also comprises a hollow shaft 219c having a length and outer surface over which a spring 219d is mounted. Spring 219d comprises an unspring length (e.g., length when not under compression or tension) that is longer than a length of the shaft 219c. Hollow shaft 219c is configured to receive a rod 219e having one end mounted to a fastener 219b, which in turn is configured to be secured to an end of a first vertical support bar 255.

Rod 219e is configured to be slidably inserted through hollow shaft 219c. A distance "D" is defined between the end of the hollow shaft 219c and the second end of the rod 219e, as shown in FIG. 2Q. When the rod 219e is fully inserted through hollow shaft 219c such that the fastener 219b abuts a second end 219m of the spring clamp, the distance D is at a maximum. This maximum distance may be referred to as $D_1$.

In one embodiment, assembly and mounting of the carrier comprises initial positioning of vertical support bar 255 on tap bar 240, attaching rod 219e to fastener 219b, insertion of the rod 219e fully through the hollow shaft 219c such that fastener 219b abuts against a second end 219m of the spring clamp 219, placement of the spring 219d over hollow shaft 219c, securement of a retainer 219f to the second end of the rod 219e, positioning the fastener 219b over vertical support bar 255, and subsequent mounting of the attachment portion 219a to tap bar 240. During mounting of attachment portion 219a, the attachment portion 219a may be pulled away from fastener 219b to thereby compress/preload spring 219d. In the example of FIGS. 2Q and 2R, the attachment portion 219a may be pulled leftward and attached at a position such that there is a gap between the fastener 219b and the second end 219m of the spring clamp 219. In this way, the attachment portion 219a exerts a leftward force on the spring 219d, which exerts a leftward force on the retainer 219f, which exerts a leftward force on the rod 219e, which exerts a leftward force on fastener 219b, which exerts a leftward force on the vertical support bar 255. This leftward force on the vertical support bar 255 ensures that the vertical support bar remains in contact with and supports the edge of the substrate 202. Of course, the spring clamp 219 can be configured to provide rightward forces on these elements in certain cases, for example by flipping and positioning the spring clamp 219 to the right of the vertical support bar 255. In many cases, the width of the gap between the fastener 219b and the second end 219m of the spring clamp 219 is less than the distance $D_1$ mentioned above. When the attachment portion 219a is pulled to the left during installation, the distance D between the end of the hollow shaft 219c and the end of the rod 219e is decreased to $D<D_1$. Distance D decreases at this time because the rod 219e remains fixed in place based on the position of vertical support bar 255 and fastener 219b, while the end of the hollow shaft 219c is pulled leftward, closer to the end of the rod 219e.

When mounted in this manner, spring clamps 219 and distance D accommodate and allow for limited amounts of movement of vertical support bars 255, while simultaneously ensuring that the vertical support bars 255 remain engaged with and continue to support the edges of the substrate 202. In some instances, such movement is needed to account for and accommodate different tolerances as well as expansion of substrates 202 that may be caused by thermal non-uniformity and thermal expansion, all of which are known to be capable of causing substrates to break and/or fall out during processing.

Figure 2S:
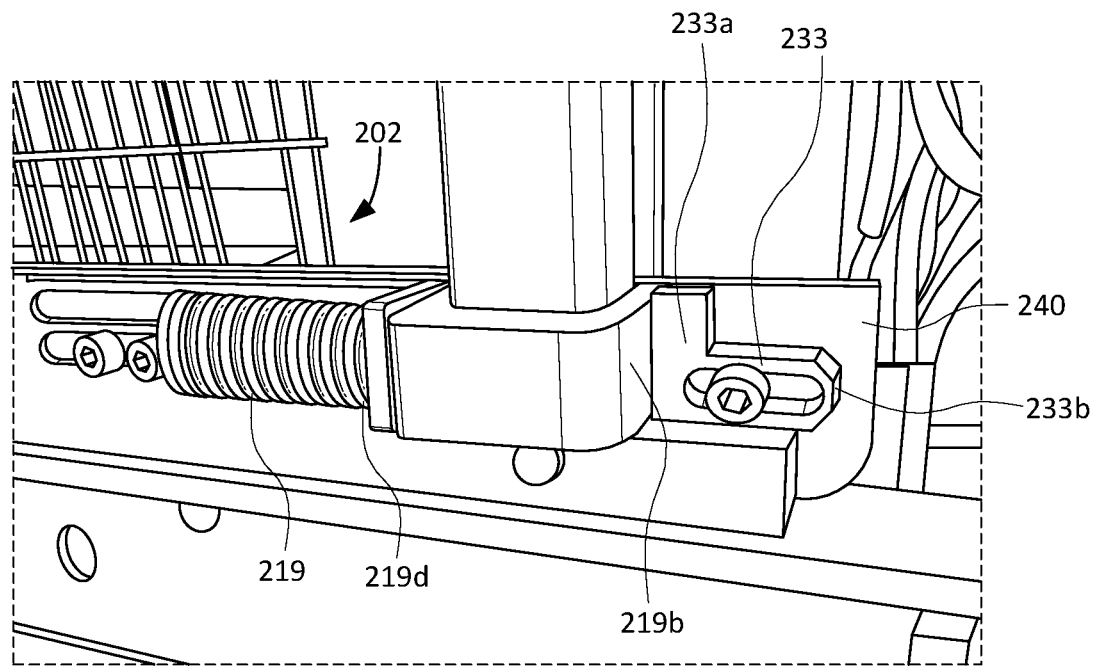
FIG. 2S depicts an example of a spring clamp according to one embodiment.

As shown in FIG. 2S, in some embodiments, to further minimize breakage of substrates it may be useful to optimize the amount/distance by which spring 219d is compressed/preloaded when positioning and securing the attachment portion 219a to the tap bar 240. To further this end, a witness clip 233 may be used. Witness clip comprises a portion 233a that is coupled against a surface of fastener 219b and a portion 233b that is coupled to tap bar 240 by a fastener positioned within an elongated slot within the portion 233b. An embodiment of use of witness clip 233 comprises processing a substrate 202 such that thermal expansion of components will be at or near a maximum. Shortly after achieving such expansion, portion 233a is abutingly positioned against a surface of fastener 219b, and portion 233b is fastened to tap bar 240. Subsequent cooling will cause thermal contraction of components, which will cause a gap to form between fastener 219b and portion 233b of the witness clip. The width of this gap can be used to determine an amount/distance that spring 219d should be compressed/preloaded to achieve a desired position of the attachment portion 219a. In this way, it can be ensured that the vertical support bar 255 continues to contact and support the edge of the substrate 202, even as the various materials thermally expand and contract over the course of processing.

Returning to FIG. 3, at operation 305, the first column of substrates 202 is loaded onto the carrier 200 by placing the substrates 202 against the first vertical support bar 255. This is also shown in FIG. 2C. The first vertical support bar 255 (as well as the other vertical support bars 255) includes a body region and a flange region. The flange region extends slightly horizontally outwards from a front face of the vertical support bar 255 and contacts the front side of the substrates 202. The body region of the vertical support bars 255 is positioned between adjacent columns of substrates 202. In FIG. 2C, the flange region of the vertical support bar 255 is shown behind the substrate 202 and behind the body region of the vertical support bar 255 (however, it is understood that FIG. 2C shows a "back side" perspective, and thus, the flange region is actually in front of and masks a peripheral region of the substrate 202 when considering the "front side" perspective typically used when coating).

As shown in FIG. 2C, the first vertical support bar 255 (as well as the other vertical support bars 255) includes a plurality of slots 271, each configured to accommodate a pin 275 that secures each substrate 202 against the body region of the vertical support bar 255, between the flange region of the vertical support bar 255 and the pin 275. The pins 275 can be installed in the slots 271 all along the height of the vertical support bar 255. In this example, the pins 275 have a shaft that extends in a direction that is parallel to the face of the substrates 202, and perpendicular to the height of the vertical support bar 255. Slots 271 provide one example of a fastener attachment position for attaching the pins 275 (or other fasteners). However, the plurality of slots 271 shown in FIG. 2B are not limited to a shape that spans across and through three faces of the support bar 255.

Figure 2T:
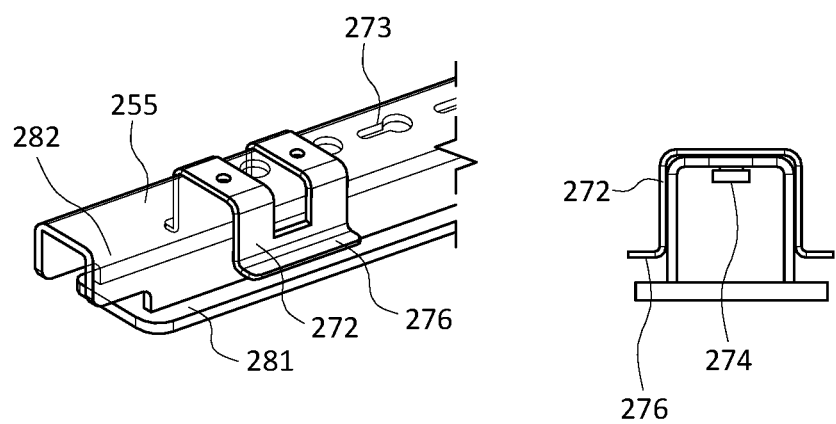
FIG. 2T shows a retainer and pin that may be used to secure the glass to the vertical support bars according to certain embodiments.

As shown in FIG. 2T, in another embodiment, a plurality of slots 273 comprise a shape that encompass one face of the support bar 255. In the embodiment of FIG. 2T, each slot 273 is configured to receive a respective pin 274 of a retainer 272 so as to couple the retainer to the vertical support bar 255. In the embodiment of FIG. 2T retainer 272 comprises two pins, however, in other embodiments, retainer can comprise fewer or more pins. Retainer 272 comprises two extending flanges 276 that define flat surfaces configured to engage and secure each substrate 202 against the body region 282 of the vertical support bar 255, between flange 281 of the vertical support bar 255 and the extending flanges 276 of the retainer 272. Pins 274 comprise a shaft that extends in a direction that is orthogonal to the face of the substrates 202, and perpendicular to the height of the vertical support bar 255. Use of slots 273, in some instances, has been found to provide support bar 255 with increased structural strength, while use of retainers 272 has been found to decrease substrate breakage. In some cases, one or more clips (see element 290 of FIG. 2P) may be provided between vertically adjacent substrates 202 in a particular column. In other cases, such clips may be omitted and there may be no physical structures positioned between vertically adjacent substrates 202. As shown in FIG. 2P, the clip 290 may have an "H" shaped cross-section, with a front plate, a back plate, and a shaft that connects the front and back plates. When considering the perspective used during processing, the front plate of the clip may be positioned in front of the front side/processing face of the substrates, the back plate of the clip may be positioned behind the back side of the substrates, and the shaft of the clip may reside at the edges of the substrates, separating vertically adjacent substrates.

Next, the second vertical support 255 bar is installed onto the carrier in operation 307. The second vertical support bar 255 is shown in FIGS. 2D and 2E, for example. The second vertical support bar 255 may slideably engage with the tap bar 240, such that it can be positioned at any desired location. Typically, the second vertical support bar 255 will be installed directly against the substrates 202 in the first column, which were previously installed. Then, in operation 309, the second column of substrates 202 is loaded onto the carrier 200. The second set of substrates 202 is loaded in the same manner as the first set of substrates 202, as shown in FIGS. 2D and 2E. The second set of substrates 202 is loaded onto the carrier 200 such that they are each in contact with the second vertical support bar 255. After the second column of substrates 202 is loaded, it is determined in operation 311 whether the carrier 200 is fully loaded with substrates. If not, the method continues with operations 313 and 315, where additional vertical support bars 255 are installed, and additional columns of substrates 202 are loaded, respectively, until the carrier 200 is full. Once the carrier 200 is fully loaded, the method continues with operation 317. Here, a final vertical support bar is installed onto the carrier, as shown in FIG. 2B. A removable spacer 265 may be temporarily provided between the final vertical support bar 255 and the vertical frame member 210 to provide a precise gap to allow for thermal expansion of the substrates 202. In certain embodiments, this gap may be verified through automated visual processing.

Figure 2U:
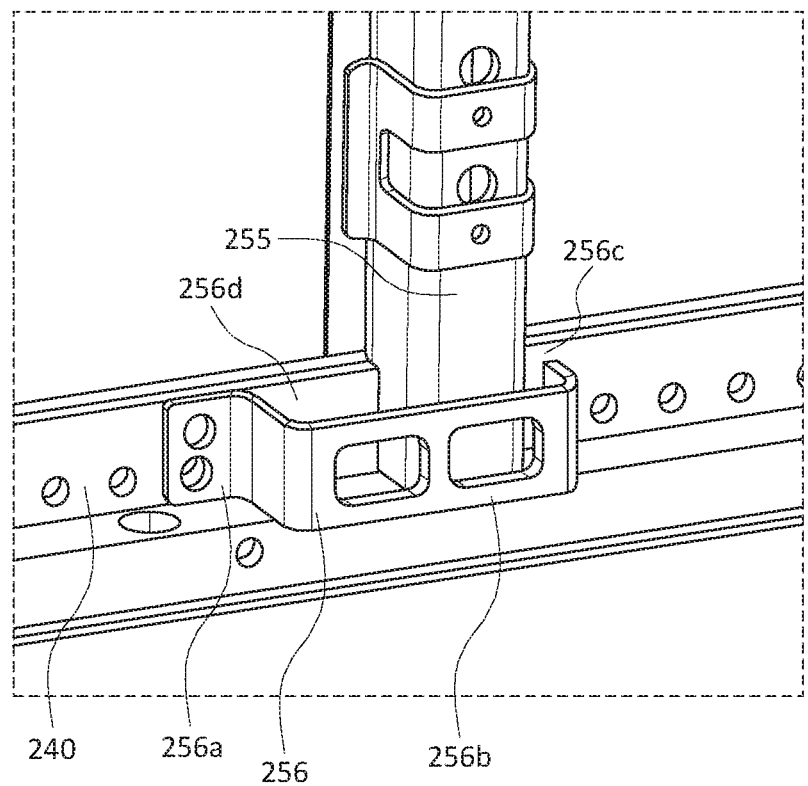
FIG. 2U illustrates a safety clip that may be used at the edges of the vertical support bars in some embodiments.

As shown in FIG. 2U, in some embodiments, one or more second vertical support bar 255 may be provided with a safety clip 256. In one embodiment, safety clip 256 is provided at a bottom end and at a top end of each second vertical support bar 255. Each safety clip 256 comprises an attachment portion 256a configured to be coupled to tap bar 240 by one or more fastener. Each safety clip 256 also comprises a retention portion 256b, wherein when attached to tap bar 240, the retention portion defines an opening 256c through which an end of a second vertical support bar 255 can be inserted or otherwise installed. The retention portion is configured to limit the distance a second vertical support bar 255 can be moved or dislodged away from a tap bar 240, for example, as may occur when a substrate 202 coupled to a support bar 255 breaks during processing of the substrate. After the second vertical support bar 255 is installed within the opening 256c, each safety clip 256 continues to allow slideable movement of each vertical support bar along tap bar 240 within a space 256d defined by the retention portion and the tap bar 240.

FIG. 2F illustrates the top region of the carrier 200. A gap is provided between the tap bar 240 and the top edge of the substrates 202. This gap allows for thermal expansion of the substrates. FIGS. 2G-2I illustrate a pivot peg 280 installed along the top edge of a substrate 202. FIG. 2G shows the pivot peg 280 in a lower position, which may be used when the substrates are cool, such as when loading the substrates onto the carrier 200. FIG. 2H shows the pivot peg 280 in an upper position, which may be used when the substrates are hot and have thermally expanded, such as during sputtering. FIG. 2I provides a perspective view of the pivot peg 280 securing the substrate 202. In some cases, the pivot peg 280 may be spring loaded. In many cases, gravity is sufficient to ensure that the pivot pegs are adequately held in place during processing.

The pivot peg 280 includes a first end that connects to the tap bar 240, and a second end that secures the top edge of the substrate 202. As shown in FIGS. 2G-2I, the second end of the pivot peg 280 may include a support structure that secures against the front side/processing side of the substrate 202. In some cases, the second end of the pivot peg 208 may secure the top edge of the substrate 202 by contacting both the front and back sides of the substrate 202. The first end of the pivot peg 280 connects to the tap bar 240 in a manner that allows the pivot peg 280 to pivot about this connection. In this way, the pivot peg can move between the positions shown in FIGS. 2G and 2H to allow for thermal expansion and contraction of the substrates and other materials.

FIGS. 2J-2O illustrate close-up views of vertical support bars 255 according to three different embodiments. In each embodiment, the vertical support bar 255 includes a flange region 281, a body region 282, and a plurality of slots 271 in the body region 282. FIGS. 2J and 2K show alternative views of a vertical support bar 255 according to a first embodiment. In this case, the body region 282 of the vertical support bar 255 is formed from a single piece of metal that is formed into the desired "U" shape. The flange region 281 is also made of a single piece of metal, though it is substantially flat. These two portions are joined together through any available means. FIGS. 2L and 2M show alternative views of a vertical support bar 255 according to a second embodiment. The second embodiment differs from the first embodiment in that it includes cutouts 283 in the piece of metal that forms the flange region 281 of the vertical support bar 255 to reduce the mass of the vertical support bar 255. FIGS. 2N and 2O illustrate alternative views of a vertical support bar 255 according to a third embodiment. The third embodiment differs from the second embodiment in that it includes additional cutouts 283 in the body region 282 of the vertical support bar 255 to further reduce the mass of the vertical support bar 255. Further, in this embodiment the vertical support bar is made only of flat pieces (e.g., the body region is formed from three pieces of metal that are attached together, rather than a single piece of metal bent into a "U" shape). By assembling the vertical support bar 255 using only flat pieces, the thickness of the metal used to form the vertical support bar 255 can be made thinner, thus further reducing the mass of the vertical support bar 255. It is advantageous to reduce the mass of the vertical support bars because this minimizes thermal non-uniformities during heating and cooling.

One advantage of the embodiments shown in FIGS. 2A-2P is the elimination of the horizontal support bars 160 used in the carrier 100 of FIGS. 1A and 1B. These horizontal support bars caused substantial problems during processing, and frequently caused breakage of the carrier, the coater, and/or the substrates. Eliminating the horizontal support bars significantly reduces the likelihood of such breakage, thereby increasing production efficiency and reducing production costs. Moreover, with the embodiments of FIGS. 2A-2P, there is no need to store a large number of horizontal support bars, which were often large and unwieldy and required substantial storage space. The hardware required to load the substrates onto the carrier is reduced and simplified (e.g., only a single type of pin is needed, only a single type of vertical support bar is needed, etc.). Overall, there are fewer parts that could potentially break, and maintenance costs are substantially reduced.

Another advantage of the embodiments of FIGS. 2A-2P is the reduced likelihood of substrate breakage during processing as a result of automated gap verification. Such automated gap verification is easier to implement because the flexible/slideable connection between the vertical support bars and the tap bars allows for all of the substrates and vertical support bars to be loaded onto the carrier in physical contact with one another. Only a single gap needs to be provided along the horizontal width of the carrier, rather than a precise gap between each horizontally adjacent pair of substrates. Because only a single gap is needed and the gap can be provided at a uniform location (e.g., at an edge of the carrier), automated gap verification (e.g., using visual processing methods) is a more feasible possibility.

Further, the elimination of horizontal support bars enables the carriers to be loaded more quickly, since there are fewer and easier steps involved with loading the substrates and verifying the gaps. In some embodiments, the carriers and methods described herein may be done in an automated manner (e.g., with a robot arm), thus further reducing the chances of misloading substrates. The elimination of the horizontal support bars also eliminates a potential source of contamination for the substrates. As mentioned above, in certain cases the horizontal support bars are telescopic. When the metal parts move over one another, tiny metallic particles can be shaved off, which can then fall onto and contaminate the substrate.

Another advantage of the embodiments shown in FIGS. 2A-2P is that most of the vertical support bars are moved to a position behind the front side/processing side of the substrate. As a result, the peripheral area of the substrates that are masked by the vertical support bars (sometimes referred to as the "bite area") can be smaller. A smaller bite area is beneficial for downstream laser processing.

Figure 4A:
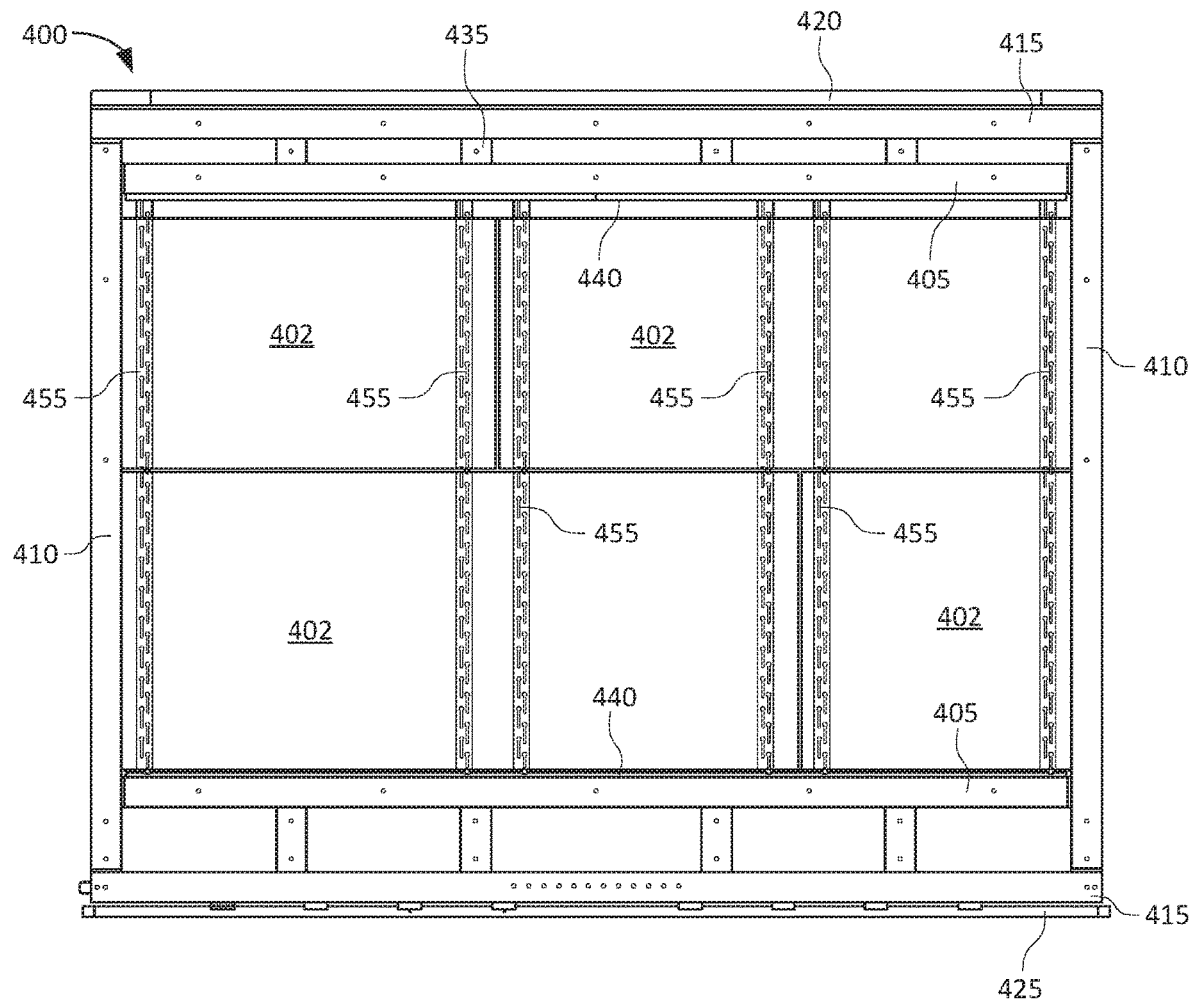
FIG. 4A depicts a carrier for supporting substrates as they move through a processing apparatus according to one embodiment.

FIGS. 4A-4G present various views of an alternative embodiment. In this case, the carrier 400 can accommodate substrates 402 of varying widths more easily. Because the substrates are not oriented in columns, there is no need to ensure that substrates in the same column all have the same width. One technique that enables this flexibility is moving the vertical support bars 455 such that they are near, but not at, the vertical edges of the substrates 402 (of course, additional vertical support bars may be provided, as well). For instance, instead of providing a single vertical support bar 255 at a position where a pair of substrates 202 are horizontally adjacent, as shown in FIG. 2A, two vertical support bars 455 can be provided, with each vertical support bar slightly horizontally offset from the vertical edges of the substrates. The two vertical support bars are offset in opposite directions, as shown in FIG. 4A, such that each adjacent substrate is supported near each of its vertical edges. In the example of FIG. 4A, four substrates 402 are loaded onto the carrier 400, and six vertical support bars 455 are used to provide support near each vertical edge of the substrates 402.

In this example, the vertical support bars 455 are positioned entirely behind the substrates 402. This may be advantageous in many embodiments because there is substantially less masking of the substrates 402, meaning that a greater proportion of the processing face of the substrate is available for processing. This can be beneficial for future laser processing, for example.

The embodiments in FIGS. 4A-4G share many similarities with the embodiments described above. For instance, the carrier 400 includes horizontal frame members 405 and 415 connected together by short struts 435. Vertical frame members 410 are connected to the horizontal frame members 405 and 415 to form the frame. A guide plate 420 and guide rail 425 may be attached to the horizontal frame members 415, as shown. A shield (not shown) similar to shield 150 of FIG. 1B may be provided.

Figure 4B:
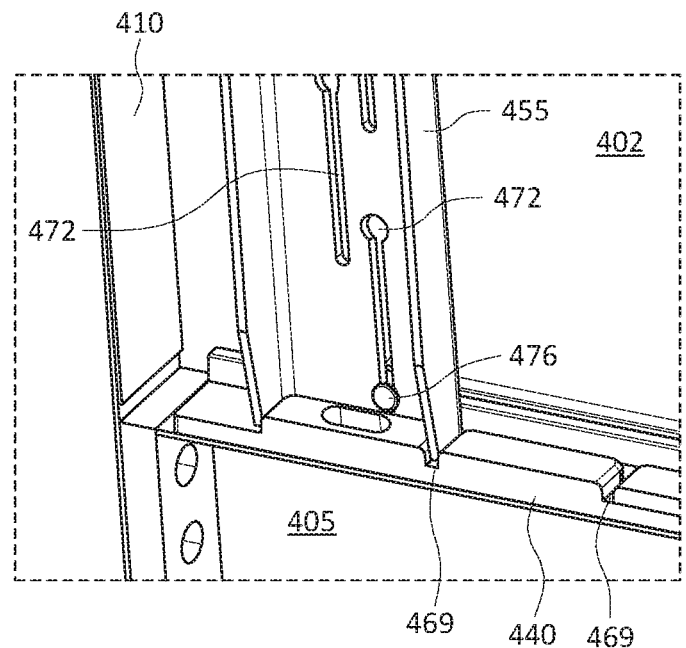
FIG. 4B shows a close-up back side view of a portion of the embodiment of FIG. 4A, showing a vertical support bar installed on a bottom tap bar.

FIG. 4B is shown from a "back side" perspective, and provides a close-up view of a vertical support bar 455 installed in slots 469 of the tap bar 440. The tap bar 440 is installed on the horizontal frame member 405. The vertical support bar 455 includes a front face and two sides. A number of slots 472 are formed in the front face of the vertical support bar 455. The slots 472 provide one example of a fastener attachment position for attaching a pin 476 or other fastener. The slots 472 are vertically oriented (e.g., their longest dimension stretches up-down), and are configured to receive the pin 476. Pin 476 is one example of a fastener that may be used to secure the substrates to the vertical support bars. In this example, the slots 472 include an opening near the top of the slots 472, and the pin 476 can fit through the opening. The pin 476 can sit at any vertical location within the slots 472. In many cases the pin 476 sits at the bottom of the slot 472, though this is not always the case. The pin 476 in FIG. 4B also maintains the substrate 402 in a co-planar position with a front flange region of the tap bar 440, as seen more clearly in FIG. 4D.

Figure 4C:
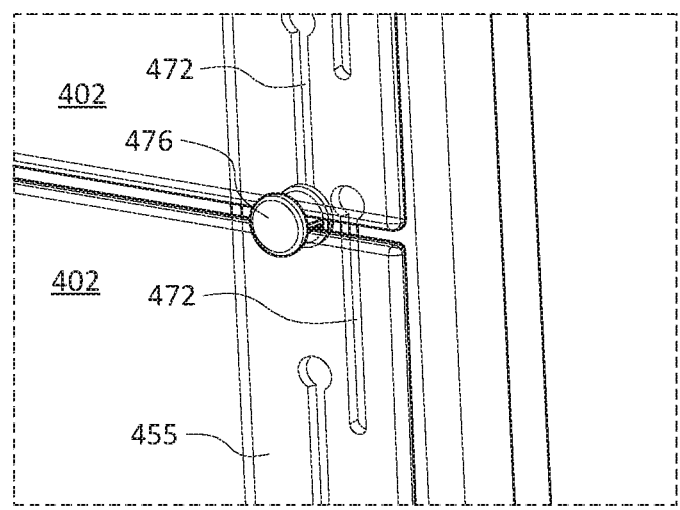
FIG. 4C shows a close-up front side view of a portion of the embodiment of FIG. 4A, showing a pin installed in a vertical support bar to secure two vertically adjacent substrates to the vertical support bar.

FIG. 4C is shown from a "front side" perspective, and provides a close-up view of pin 476 securing two substrates 402 onto vertical support bar 455. The pins 476 maintain the substrates 402 in position such that they are co-planar and vertically separated from one another.

Figure 4D:
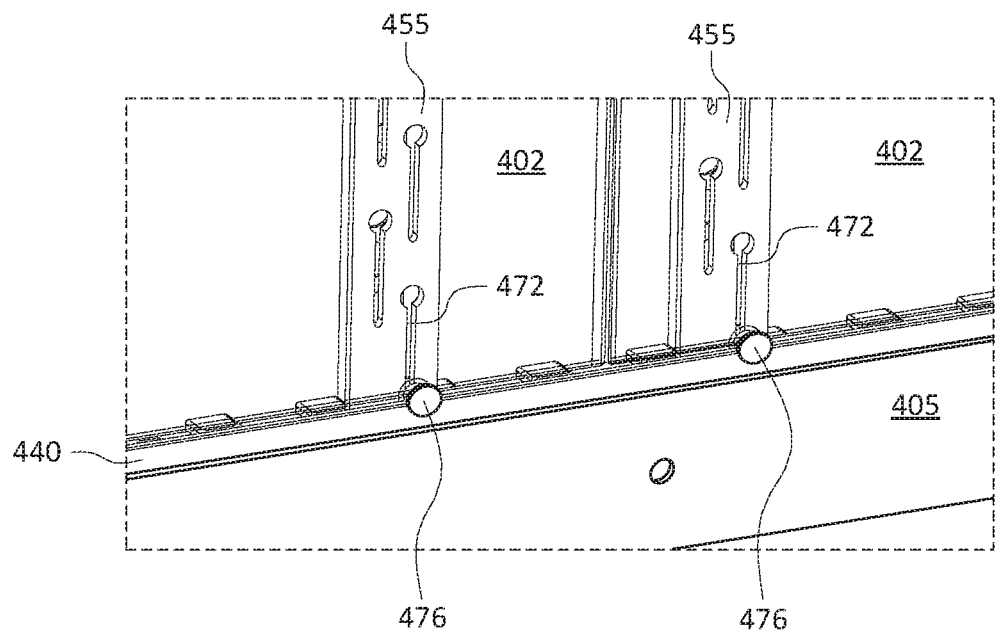
FIG. 4D illustrates a close-up front side view of a portion of the embodiment of FIG. 4A, showing two substrates secured onto vertical support bars and the bottom tap bar through the use of pins.

FIG. 4D is also shown from a "front side" perspective, and illustrates pins 476 securing two substrates 402 onto two vertical support bars 455. The pins 476 also maintain the substrates 402 in a coplanar relationship with a front flange region of the vertical support mount 440. The vertical support bars 455 are provided at a position that is near, but slightly removed from, the vertical edge where the two substrates 402 meet. The pins 476 are installed within slots 472 of the vertical support bars.

Figure 4E:
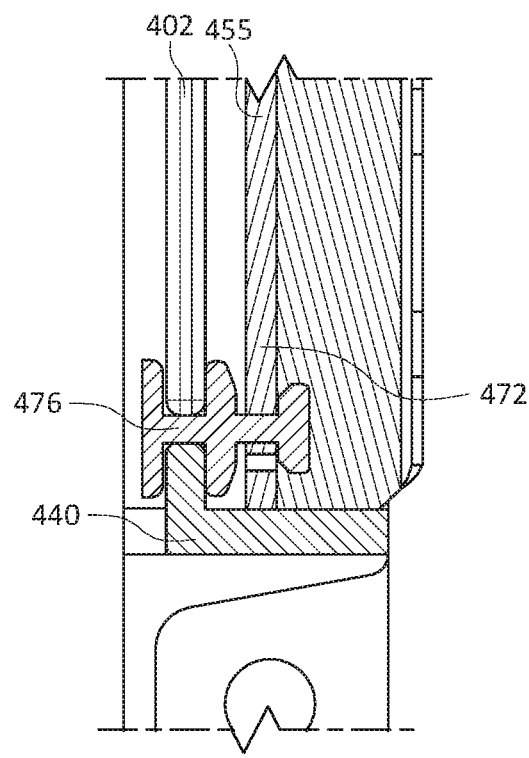
FIG. 4E shows a cross-sectional view of the embodiment shown in FIG. 4D.

FIG. 4E shows a cross-sectional view of the configuration shown in FIG. 4D. Specifically, FIG. 4E shows a pin 476 installed in a slot 472 to secure a substrate 402 onto a vertical support bar 455, at the bottom of the vertical support bar 455 where it connects to the tap bar 440. As described above, the pin 476 secures the substrate 402 and maintains it in a coplanar relationship with the front flange region of the tap bar 440. In FIG. 4E, the front side/processing face of the substrate is on the left, and the back side of the substrate is on the right.

The pin 476 includes a front plate, a back plate, a middle plate, and a shaft that connects the front, middle, and back plates. The plates are relatively small, but are sufficiently large to secure the edges of the substrates 402. In FIG. 4E, the front plate is shown on the left portion of pin 476 (in front of the front side/processing face of the substrate 402), the back plate is shown on the right portion of pin 476 (behind the face of the vertical support bar 455), and the middle plate is positioned between the front and back plates (and between the back side of the substrate and the face of the vertical support bar 455). The shaft of pin 476 extends in a direction perpendicular to the face of the substrates 402.

Figure 4F:
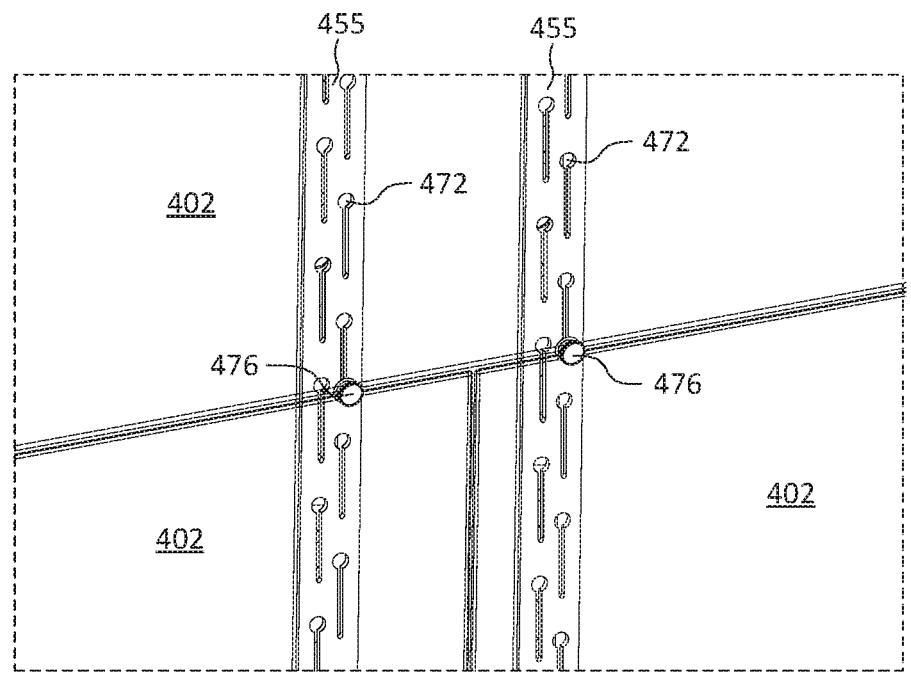
FIG. 4F illustrates a close-up front side view of a portion of the embodiment of FIG. 4A, showing three substrates loaded onto two vertical support bars via pins.

FIG. 4F illustrates a "front side" view of three substrates 402 loaded onto two vertical support bars 455. The pins 476 fit into the slots 472 to secure the substrates 402 to the vertical support bars 455. The pins 476 are positioned between adjacent edges of vertically adjacent substrates 402. Notably, the substrates 402 are not oriented in columns, and substrates of any width can be matched together as desired. Instead of columns, the substrates are oriented in rows, with substrates in the same row having the same height. While some substrate geometry matching may still be involved, there is substantially more flexibility with carrier layout, and the problems associated with the horizontal support bars are eliminated.

Figure 4G:
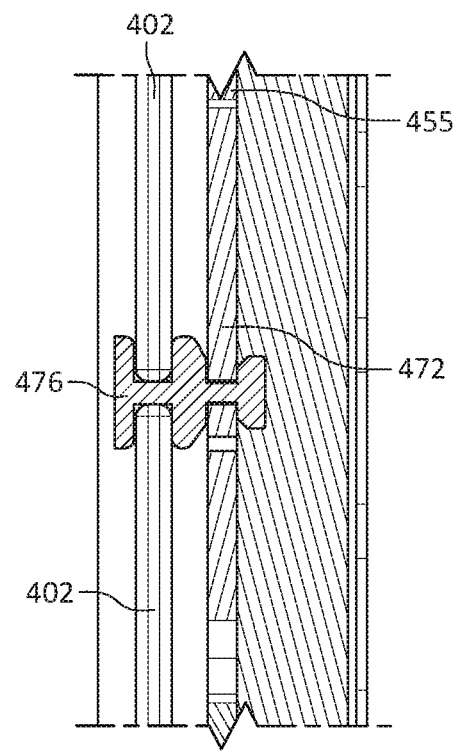
FIG. 4G depicts a cross-sectional view of the embodiment shown in FIG. 4F.

FIG. 4G depicts a cross-sectional view of the configuration shown in FIG. 4F. Specifically, FIG. 4G shows a pin 476 securing and separating two vertically adjacent substrates 402. The pin 476 maintains the two substrates 402 in a coplanar relationship. The clip 476 shown in FIG. 4G is similar or identical to the pin 476 shown in FIG. 4E. One difference is that clip 476 of FIG. 4E is positioned between a single substrate and the front flange region of the tap bar 440, while the clip 476 of FIG. 4G is positioned between two vertically adjacent substrates.

The pin 476 of FIGS. 4B-4G is similar to the clip 290 of FIG. 2P. While the clip 290 separates vertically adjacent substrates, the pin 476 does the same while simultaneously securing the substrates to the vertical support bar 455. The clip 290 includes only two plates (e.g., front plate and back plate), while the pin 476 includes an additional middle plate. These two elements function in similar manners to secure adjacent substrates in a co-planar relationship. In some embodiments, both may be used.

Although not shown in FIGS. 4A-4G, pivot pegs may be provided along the top edge of the substrates 402, similar to pivot pegs 280 shown in FIGS. 2G-2I. Various other details described in relation to the embodiments of FIGS. 2A-2P may also apply to the embodiments of FIGS. 4A-4G. The various hardware components can be combined as desired for a particular application.

The embodiments shown in FIGS. 4A-4G provide many of the same benefits described above in relation to the embodiments of FIGS. 2A-2P. One notable benefit is the elimination of the horizontal support bars, which previously introduced many processing challenges. Another important advantage is that the substrates are able to thermally expand (both horizontally and vertically) during processing, with a substantially reduced likelihood of breakage. In the embodiment of FIGS. 2A-2P, the substrates can expand horizontally and vertically without breaking, without the need to provide a precise gap between each pair of horizontally adjacent substrates, due to the fact that the vertical support bars can slide or otherwise move horizontally along the tap bars to accommodate such expansion and contraction. In the embodiment of FIGS. 4A-4G, the substrates can expand and contract horizontally without breaking, without the need to provide a precise gap between each pair of adjacent substrates, due to the fact that the substrates can move horizontally while still secured by the pins 476. As such, the process of loading the substrates onto the carrier is substantially simplified. Instead of providing precise gaps between each pair of horizontally and/or vertically adjacent substrates, the substrates can be loaded relatively tightly against one another and/or against the vertical support bars. Only two gaps need to be provided, one that allows vertical expansion (e.g., the gap between the top edge of the substrates and the upper tap bar) and one that allows for horizontal expansion (e.g., typically but not necessarily proximate a vertical frame member). As the substrates expand, they can gently push one other within the plane of the substrates, such that one or more of the substrates expand into each gap. With the designs described herein, the risks of substrate and coater breakage are significantly reduced.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A carrier for holding multiple substrates in a substantially vertical orientation while passing through a coater that provides a coating on at least a front surface of the multiple substrates, the carrier comprising:
- a frame with an aperture having a horizontal dimension and a vertical dimension;
- a bottom tap bar affixed to the frame and extending horizontally along a bottom portion of the aperture;
- a top tap bar affixed to the frame and extending horizontally along a top portion of the aperture;
- a plurality of vertical support bars, each comprising:
  - (i) a length permitting engagement with both the top tap bar and the bottom tap bar while extending vertically across the aperture,
  - (ii) a body region extending along the length of the vertical support bar,
  - (iii) a plurality of slots in the body region, and
  - (iv) a vertical support flange region extending outwards from the body region;

wherein:
- the carrier further comprises a plurality of pins, each pin being configured to engage with a respective one of the plurality of slots; and
  - (a) a plurality of retainers, wherein each pin is configured to engage with a respective one of the plurality of slots and of the plurality of retainers, each retainer comprising a retainer flange, the pin extending, in a direction orthogonal to the front surface, through the respective slot, and each substrate is positioned partially between (1) the vertical support bar flange region of one of the plurality of vertical support bars and (2) the retainer flange of one of the plurality of retainers, or
  - (b) each pin is configured to engage with a respective one of the plurality of slots, the pin extending, in a direction parallel to the front surface and orthogonal to the length of the vertical support bar, through the respective slot, the slots being configured to accommodate the pins such that the pins secure the substrates against the body region of the vertical support bar between the flange region of the vertical support bar and the pin.

2. The carrier of claim 1, wherein the horizontal dimension of the aperture is between about 50 inches and 200 inches.

3. The carrier of claim 1, wherein the vertical dimension of the aperture is between about 50 inches and 150 inches.

4. The carrier of claim 1, wherein each vertical support bar comprises a hollow structure comprising a first face, a second face, a third face, and a fourth face, as viewed along the length of the vertical support bar, the first face being connected to the second face, the second face being connected to the third face, the third face being connected to the fourth face, the fourth face being connected to the first face.

5. The carrier of claim 4, wherein the wherein the plurality of slots in the body region of each vertical support bar are positioned on the second face of the vertical support bar, without extending onto the first face or third face of the vertical support bar.

6. The carrier of claim 1, wherein the substrates are windows for coating with an electrochromic device, the substrates are glass or plastic and/or the frame comprises metal.

7. The carrier of claim 1, wherein the bottom tap bar and/or top tap bar comprise a material that expands and contracts to approximate a thermal expansion and/or contraction of the substrates.

8. The carrier of claim 1, wherein the vertical support bars, the bottom tap bar and/or the top tap bar comprise metal.

9. The carrier of claim 1, wherein the plurality of pins contact the substrates to thereby sandwich the substrates between the plurality of pins and the vertical support bar flange region on the plurality of vertical support bars.

10. The carrier of claim 1, further comprising a pivot peg attached to the top tap bar and/or a transport mechanism for moving the carrier through the coater.

11. The carrier of claim 1, further comprising a shield configured to protect at least a portion of the frame during coating.

* * * * *